United States Patent [19]
Yamagata et al.

[11] Patent Number: 5,677,875
[45] Date of Patent: Oct. 14, 1997

[54] NON-VOLATILE SEMICONDUCTOR MEMORY DEVICE CONFIGURED TO MINIMIZE VARIATIONS IN THRESHOLD VOLTAGES OF NON-WRITTEN MEMORY CELLS AND POTENTIALS OF SELECTED BIT LINES

[75] Inventors: Yasushi Yamagata; Masakazu Amanai, both of Tokyo, Japan

[73] Assignee: NEC Corporation, Tokyo, Japan

[21] Appl. No.: 606,860

[22] Filed: Feb. 26, 1996

[30] Foreign Application Priority Data

Feb. 28, 1995 [JP] Japan ............... 7-067048
Feb. 7, 1996 [JP] Japan ............... 8-020820

[51] Int. Cl.$^6$ ............................................. G11C 7/00
[52] U.S. Cl. ........................ 365/185.26; 365/185.11; 365/185.29; 365/218
[58] Field of Search ............... 365/185.11, 185.26, 365/185.29, 218, 189.01

[56] References Cited

U.S. PATENT DOCUMENTS

| | | | |
|---|---|---|---|
| 4,958,317 | 9/1990 | Terada | 365/104 |
| 5,274,588 | 12/1993 | Manzur et al. | 365/185.26 |
| 5,379,255 | 1/1995 | Shah | 365/185.26 |
| 5,384,742 | 1/1995 | Miyakawa et al. | 365/185.26 |

FOREIGN PATENT DOCUMENTS

| | | |
|---|---|---|
| 57-150192 | 9/1982 | Japan. |
| 64-32494 | 2/1989 | Japan. |
| 2-117176 | 5/1990 | Japan. |

*Primary Examiner*—Son T. Dinh
*Attorney, Agent, or Firm*—Foley & Lardner

[57] ABSTRACT

A non-volatile semiconductor memory device is provided in which a variation of threshold voltages of non-written memory cells and a potential variation of a selected bit line in preventing generation of drain disturb phenomenon are minimized Source lines $SL_1'$, $SL_2'$, $SL_3'$ and $SL_4'$ are provided in parallel to word lines $WL_1$, $WL_2$, $WL_3$ and $WL_4$, respectively, and selectively. When a data is to be written in a memory cell $C_{11}$, a potential of a selected word line $WL_1$ is set to a high voltage $V_{pp}$, potentials of non-selected word lines $WL_2$, $WL_3$ and $WL_4$ are set to the drain disturb preventing voltage, for example, an intermediate voltage $V_{pp}/2$ which is a half of the high voltage. Further, a potential of a selected bit line $BL_1$ is set to a potential $V_{dd}$ which is lower than the high voltage $V_{pp}$, non-selected bit lines $BL_2$, $BL_3$ and $BL_4$ are made open. Further, a potential of a selected source line $SL_1'$ is set to the ground potential GND and the non-selected source lines $SL_2'$, $SL_3'$ and $SL_4'$ are made open.

18 Claims, 19 Drawing Sheets

N-CHANNEL DEPLETION

NON-VOLATILE SEMICONDUCTOR MEMORY DEVICE CONFIGURED TO MINIMIZE VARIATIONS IN THRESHOLD VOLTAGES OF NON-WRITTEN MEMORY CELLS AND POTENTIALS OF SELECTED BIT LINES

BACKGROUND OF THE INVENTION

The present invention relates to a non-volatile semiconductor memory device and, in particular, to an electrically erasable and programmable read only memory device (called hereinafter an "E²PROM").

As well known in the art, the E²PROM includes a plurality of memory cells each constituted by a cell transistor. Referring to FIG. 13, the cell transistor includes a source region 1003S and a drain region 1003D of an N⁺ type which are formed in an active region of a semiconductor substrate 1001 surrounded by a field oxide layer 1002. The regions 1003S and 1003D defines a channel region on which a floating gate 1004 and a control gate 1005 are formed in isolation from one another by a gate insulating layer 1006. An insulating layer immediately below the floating gate 1004 is as thin as 60–200 Å and is referred to as a tunnel insulating layer.

An operation of this memory cell transistor shown in FIG. 13 will be described with reference to FIG. 14.

In a data programming operation, the source region 1003S is grounded and high voltages $V_{dd}$ and $V_{pp}$ are applied to the drain region 1003D and the control gate 1005, respectively, as shown in FIG. 14(A). In this case, the voltage $V_{pp}$ is, for example, about 6–12 V and the voltage $V_{dd}$ is lower than the voltage $V_{pp}$ by, for example, a threshold voltage of a MOS transistor. As a result, electrons produced due to impact ionization in the vicinity of the drain region 1003D are generated and thus injected into the floating gate 1004, thus data being programmed.

In a data read operation, the source region 1003S is grounded and a voltage $V_{cc}$ (for example, about 5V) is applied to the control gate 1005, as shown in FIG. 14(B). As a result, a potential of the drain region 1003D is changed correspondingly to an amount of electrons in the floating gate 1004, with which a read operation is performed.

In a data erasing operation, a high voltage $V_{pp}$ is applied to the source region 1003S and the drain region 1003D and the control gate 1005 are grounded, as shown in FIG. 14(C). In this case, the drain region 1003D may be open-circuited. Thus, electron is tunnel-discharged from the floating gate 1004 to the source region 1003S, resulting in an erase operation.

FIG. 15 shows a circuit diagram of a conventional NOR type E²PROM using non-volatile memory cell transistors shown in FIG. 9, which is provided with four word lines $WL_1$, $WL_2$, $WL_3$ and $WL_4$, four bit lines $BL_1$, $BL_2$, $BL_3$ and $BL_4$ which are perpendicular to the word lines and four source lines $SL_1$, $SL_2$, $SL_3$ and $SL_4$ which are also perpendicular to the word lines. A memory cell array 1 comprises memory cells $C_{11}$, $C_{12}$, . . . , $C_{44}$ which are connected between the word lines $WL_1$, $WL_2$, $WL_3$ and $WL_4$, the bit lines $BL_1$, $BL_2$, $BL_3$ and $BL_4$ and the source lines $SL_1$, $SL_2$, $SL_3$ and $SL_4$. In this example, sources of the respective memory cells are commonly connected to a source circuit 2 through the source lines $SL_1$, $SL_2$, $SL_3$ and $SL_4$, drains thereof are connected to the respective bit lines $BL_1$, $BL_2$, $BL_3$ and $BL_4$ and control gates thereof are connected to the word lines $WL_1$, $WL_2$, $WL_3$ and $WL_4$.

In the erasing mode, the source circuit 2 operates to apply a voltage $V_{pp}$ to the sources of the respective memory cells $C_{11}$, $C_{12}$, . . . , $C_{44}$ and, in the non-erase mode, the source circuit 2 operates to apply GND voltage (=0V) to the sources of the respective memory cells $C_{11}$, $C_{12}$, . . . , $C_{44}$. The source circuit 2 will be described in detail later.

A row selection circuit 3 responds to row address signals $A_1$ and $A_2$ and inverted row address signals $A_1'$ and $A_2'$ to select one of the word lines $WL_1$, $WL_2$, $WL_3$ and $WL_4$. A potential of the selected word line is made $V_{pp}$ in the write mode and $V_{cc}$ in the read mode. The potential is made GND in the erase mode (ER="1"). The row selection circuit 3 will be further described in detail later.

The bit lines $BL_1$, $BL_2$, $BL_3$ and $BL_4$ are connected to switching transistors $Q_{c1}$, $Q_{c2}$, $Q_{c3}$ and $Q_{c4}$ of a row switching circuit 4.

A column selection circuit 5 responds to column address signals $B_1$ and $B_2$ and inverted column address signals $B_1'$ and $B_2'$ to select one of column selection lines $CL_1$, $CL_2$, $CL_3$ and $CL_4$. A potential of the selected column selection line is made $V_{pp}$ in the write mode and $V_{cc}$ in the read mode. The potential is made GND in the erase mode (ER="1"). The column selection circuit 5 will be described in detail later.

The bit lines $BL_1$, $BL_2$, $BL_3$ and $BL_4$ are connected to a write amplifier 6 and a sense amplifier 7 of current detection type through the switching transistors $Q_{c1}$, $Q_{c2}$, $Q_{c3}$ and $Q_{c4}$ of the column switching circuit 4. The write amplifier 6 will be described in detail later.

A control circuit 8 responds to a write/read signal W/R, etc., to supply an erase mode signal ER to the source circuit 2, the row selection circuit 3 and the column selection circuit 5 and supply a program signal PG which is a write mode signal to a voltage generator circuit 9.

The voltage generator circuit 9 generates a voltage $V_{pp}/V_{cc}$. When the program signal PG is "1", $$V_{pp}/V_{cc}=V_{pp}$$

and, when the program signal PG is "0", $$V_{pp}/V_{cc}=V_{cc}$$

The voltage $V_{pp}/V_{cc}$ is supplied to the row selection circuit 3 and the column selection circuit 5. The voltage generator circuit 9 will be described in detail later.

FIG. 16 shows the source circuit 2 shown in FIG. 15 in detail. The source circuit 2 comprises an inverter 201 having the voltage $V_{pp}$ as a power source, an inverter 202 having the voltage $V_{cc}$, a P channel enhancement type transistor 203 and an N channel enhancement type transistor 204. In the erase mode (ER="1"), the transistor 203 is on and the transistor 204 is off, so that the source potentials of the respective memory cells $C_{11}$, $C_{12}$, . . . , $C_{44}$ becomes $V_{pp}$. On the other hand, in the non-erase mode (ER="0"), the transistor 203 is off and the transistor 204 is on, so that the source potentials of the respective memory cells $C_{11}$, $C_{12}$, . . . , $C_{44}$ become GND.

FIG. 17 shows the row selection circuit 3 shown in FIG. 15 in detail. The column selection circuit 5 is similar to the row selection circuit 3 and the following description is applicable to both the row selection circuit 3 and the column selection circuit 5. That is, the row selection circuit 3 (column selection circuit 5) includes NAND type logic circuits 31, 32, 33 and 34 with respect to the word lines $WL_1$, $WL_2$, $WL_3$ and $WL_4$. For example, the NAND type logic circuit 31 comprises a NAND circuit 311 responsive to address signals $A_1$ and $A_2$ ($B_1$ and $B_2$), an inverter 312 having the voltage $V_{cc}$ as a power source, an inverter 313 having the voltage $V_{pp}/V_{cc}$ as a power source and a P channel enhancement type transistor 314. The NAND circuit 311 is also responsive to an inverted erase mode signal ER through an inverter 300. Similarly, the NAND type logic circuits 32, 33 and 34 comprise NAND circuits 321, 331 and 341, inverters 322, 332 and 342, inverters 323, 333 and 343 and P channel enhancement type transistors 324, 334 and 344, respectively. Therefore, in the erase mode (ER="1"), all of the NAND circuits 311, 321, 331 and 341 are disabled and so the potentials of the word lines $WL_1$, $WL_2$, $WL_3$ and $WL_4$ (the column selection lines $CL_1$, $CL_2$, $CL_3$ and $CL_4$) become GND. In this case, the bit lines $BL_1$, $BL_2$, $BL_3$ and $BL_4$ become opened. On the other hand, in the write mode (ER="0", PG="1"), an output of one of the NAND circuits 311, 321, 331 and 341 becomes GND, that is, an output of one of the inverters 312, 322, 332 and 342 becomes high level. As a result, a potential of one of the word lines $WL_1$, $WL_2$, $WL_3$ and $WL_4$ (the column selection lines $CL_1$, $CL_2$, $CL_3$ and $CL_4$) becomes $V_{pp}/V_{cc}=V_{pp}$. Also, in the read mode (ER="0", PG="0"), an output of one of the NAND circuits 311, 321, 331 and 341 becomes GND, that is, an output of one of the inverters 312, 322, 332 and 342 becomes high level. In this case, a potential of one of the word lines $WL_1$, $WL_2$, $WL_3$ and $WL_4$ (the column selection lines $CL_1$, $CL_2$, $CL_3$ and $CL_4$) becomes $V_{pp}/V_{cc}=V_{cc}$.

FIG. 18 shows the write amplifier 6 in FIG. 15 in detail. The write amplifier 6 comprises a NAND circuit 601 responsive to the program signal PG and an input data signal DI, an inverter 602 having the voltage $V_{cc}$ as a power source, an inverter 603 having the voltage $V_{pp}$ as a power source, a P channel enhancement type transistor 604 and an N channel enhancement type transistors 605 and 606. Therefore, only when PG=DI="1", an output of the inverter 602 becomes high level and the gate voltage of the transistor 605 becomes $V_{pp}$, so that an output of the transistor 605 becomes a voltage $V_{dd}$ that is lower than the $V_{pp}$ level by the threshold voltage of the transistor 605. The programming is thus performed. Here, the potential $V_{dd}$ is lower than $V_{pp}$ and is in a range of 0–6 V, for example.

FIG. 19 shows the voltage generator circuit 9 shown in FIG. 15 in detail. That is, the voltage generator circuit 9 includes an N channel enhancement type transistor 901 connected to the power source $V_{pp}$ and an N channel depletion type transistor 902. The transistor 901 is controlled by a pumping circuit 903 which generates a voltage higher than $V_{pp}$ and the transistor 902 is controlled by an inverter 904. The pumping circuit 903 and the inverter 904 are controlled by the program signal PG. Therefore, when PG="1", the transistor 901 is on, so that it becomes $V_{pp}/V_{cc}=V_{pp}$. On the other hand, when PG="0", the transistor 901 becomes on, resulting in a s $V_{pp}/V_{cc}=V_{cc}$.

In the non-volatile semiconductor memory device shown in FIG. 15, there is the so-called drain disturb phenomenon generated in non-selected memory cells during the data write mode. When data is written in, for example, the memory cell $C_{11}$, there is a possibility of generation of the drain disturb phenomenon in the non-selected memory cells $C_{21}$, $C_{31}$, $C_{41}$. That is, when the data is written in the memory cell $C_{11}$, a potential of the source line $SL_1$ becomes GND and a potential of the bit line $BL_1$ is made $V_{dd}$ which is slightly lower than $V_{pp}$. As a result, there is a possibility of generation of the drain disturb phenomenon in the non-selected memory cells $C_{21}$, $C_{31}$, $C_{41}$ which are connected to the same bit line $BL_1$ and the source line $SL_1$ as those connected to the memory cell $C_{11}$.

The principle of generation of the drain disturb phenomenon in a memory cell, for example, $C_{21}$, which has been written with a data will be described with reference to FIG. 20(A). In such case, electron is accumulated in the floating gate 1004. Since the source 1003S and the control gate 1005 are grounded and the drain is applied with $V_{dd}$, electron-hole pairs are generated in a drain depletion layer X due to the week avalanche effect caused by strong electric field therein. Therefore, a portion of the holes passes over a barrier of the tunnel insulating layer into the floating gate 1005 by a vertical electric field as shown by an arrow X1. As a result, an amount of electron accumulated in the floating gate 1005 is reduced. Further, since a strong electric field is applied to the tunnel insulating layer between the floating gate 1004 and the drain region 1003D, electron in the floating gate 1004 is discharged to the drain region 1003D by the Fowler-Nordheim tunneling effect as shown by an arrow X2. As a result, the amount of electron accumulated in the floating gate 1004 is also reduced. Therefore, as shown in FIG. 21, the threshold voltage $V_{th}(V)$ is lowered with a drain disturb stress time t in which stress is exerted on the respective memory cells during a write operation of the memory cell array. Therefore, when the stress exertion time $t=t_1$, the threshold voltage $V_{th}$ becomes the same level as the threshold voltage of memory cells which are not written as yet and the data is changed.

The principle of generation of the drain disturb phenomenon of a memory cell, for example, $C_{21}$, which is not written as yet will be described with reference to FIG. 20(B). In such case, there is no electron accumulated in the floating gate 1004. Instead, the potential of the floating gate 1004 rises due to a capacitive coupling between the drain region 1003D and the floating gate 1004.

Incidentally, Japanese Patent Application Laid-open No. Sho 57-150192 describes that this rise of the floating gate potential lowers the bit line voltage and blocks a data write operation. As a result, electron starts to flow through the channel as shown by an arrow Y1. This electron moves into the drain depletion layer Y and electron-hole pairs are generated due to the impact ionization effect. Therefore, as shown by an arrow Y2, a portion of the holes passes over the barrier of the tunnel insulating layer into the floating gate 1004 by the vertical electric field. As a result, the amount of electron in the floating gate 1004 is reduced and the threshold voltage $V_{th}$ is lowered as shown by a solid curve of non-written memory cell in FIG. 21. Incidentally, depending upon the direction of the vertical electric field, a portion of electron may be injected into the floating gate 1004 as shown by an arrow Y3. In such case, the threshold voltage $V_{th}$ rises as shown by a dotted curve in FIG. 21. In this manner, in the non-written memory cell, the threshold voltage $V_{th}$ of the memory cell is lowered to cause the memory cell to be normally on, causing the memory cell array 1 to be unable to operate normally.

The above-mentioned stress exertion time t is given by (write time per memory cell)×(number of memory cells connected to one bit line).

The above-described drain disturb phenomenon is commonly generated in the floating gate type non-volatile semiconductor memory device having the NOR construction. In the flash E²PROM having the tunnel insulating layer, the drain disturb phenomenon is specifically considerable since electric field is concentrated in the drain depletion layer. Although such drain disturb phenomenon has been avoidable usually by setting the drain voltage during the data write, that is, the selected bit line voltage $V_{dd}$, sufficiently low. However, in the recent highly integrated memory cell array in which stress exertion time is increased due to increase of integration density of the memory cell array and electric field in the drain depletion layer is increased due to reduction of the memory cell size and reduction of thickness of the tunnel insulating layer, such phenomenon can not be avoided by merely lowering the selected bit line voltage $V_{dd}$.

In order to prevent the drain disturb phenomenon, Japanese Patent Application Laid-open Nos. Sho 64-32494 and Hei 2-117176 propose that, when a data is written by selecting a memory cell $C_{11}$, a potential of a selected word line $WL_1$ is set to $V_{pp}$ and potentials of non-selected word lines $WL_2$, $WL_3$ and $WL_4$ are set to a drain disturb preventing voltage say, an intermediate voltage $V_{pp}/2$, to relax electric field in the drain depletion layers of the non-selected memory cells $C_{21}$, $C_{31}$, $C_{41}$ and relax the electric field between the floating gates and the drain regions to thereby restrict the generation of drain disturb phenomenon, as shown in FIG. 22.

However, the conventional write method shown in FIG. 22 is not completely effective for non-written memories.

First, as shown in FIG. 23, when a voltage $V_9$ of non-selected word line in a non-written memory cell is set to 0 V, holes are injected into a floating gate and the threshold voltage $V_{th}$ is lowered. On the contrary, when the voltage $V_9$ is 2 V, electron is injected into the floating gate and the threshold voltage $V_{th}$ is increased. When the voltage $V_9$ is set to 1 V which may be optimal, the threshold voltage $V_{th}$ fluctuates after the stress exertion time t=1s.

Second, a channel current flows even in a non-written memory cell. Therefore, when the number of memory cells per bit line is large, current flowing from the selected bit line through non-selected, non-written memory cells is increased, causing a potential of the selected bit line to be lowered. In this case, the snap back state in which negative resistance is generated is established even when the number of non-selected, non-written memory cells is small and the potential of the selected bit line is also lowered, resulting in that write operation to the selected memory cell becomes difficult. Although it can be considered in order to reduce the current flowing from the selected bit line through non-selected, non-written memory cells to apply the intermediate voltage $V_{pp}/2$ to the source lines $SL_1$, $SL_2$, $SL_3$ and $SL_4$ as shown in FIG. 24. However, this is not desirable since the write speed is lowered.

SUMMARY OF THE INVENTION

An object of the present invention is, therefore, to provide a non-volatile semiconductor memory device in which a variation of the threshold voltage of non-written memory cells is restricted and a potential variation of selected bit line is restricted.

Another object of the present invention is to provide a memory device in which the above-mentioned problems are solved without applying an intermediate voltage to source lines.

In a memory device according to the present invention, there are provided source lines in parallel to word lines, respectively and selectively. Assuming that a data is to be written in one memory cell, a potential of a selected word line is set to a high voltage $V_{pp}$, potentials of non-selected word lines are set to the drain disturb preventing voltage, for example, an intermediate voltage $V_{pp}/2$ which is a half of the high voltage. Further, a potential of a selected bit line is set to a potential $V_{dd}$ which is lower than the high voltage $V_{pp}$, and non-selected bit lines are made open. Further, a potential of a selected source line is set to the ground potential GND and the non-selected source lines are made open.

With the construction mentioned above, since the non-selected memory cells are connected to the selected bit line, they are influenced by the drain disturb phenomenon. However, since the non-selected word lines of the non-selected memory cells are applied with the intermediate voltage $V_{pp}/2$ the electric field in the drain depletion layer of the memory cell is relaxed and the electric field between the floating gate and the drain region is also relaxed when the latter memory cell is already written. As a result, the drain disturb phenomenon is restircted. Therefore, even when the drain disturb voltage of the selected bit line exceeds 3 V, generation of the drain disturb phenomenon is restricted. On the other hand, when the selected memory cell is a non-programmed one, the non-selected source line is in the open state. Therefore, the channel current is restricted and so that generation of the drain disturb phenomenon is also restricted.

Incidentally, in the non-written memory cell, the threshold voltage $V_{th}$ is not changed even if the stress exertion time t is in the order of 1 sec. Further, in the programmed memory cell, the drain disturb phenomenon is substantially completely restricted by making the drain disturb preventing voltage $V_9$ in the order of 4 V and thus the drain disturb life becomes about 1000 times compared with conventionally obtainable one.

That is, in the non-selected memory cell, the drain disturb phenomenon is restricted regardless of the state of the memory cell, written or non-written state.

DETAILED DESCRIPTION OF THE PREFERRED EMBODIMENTS

Figure 1:
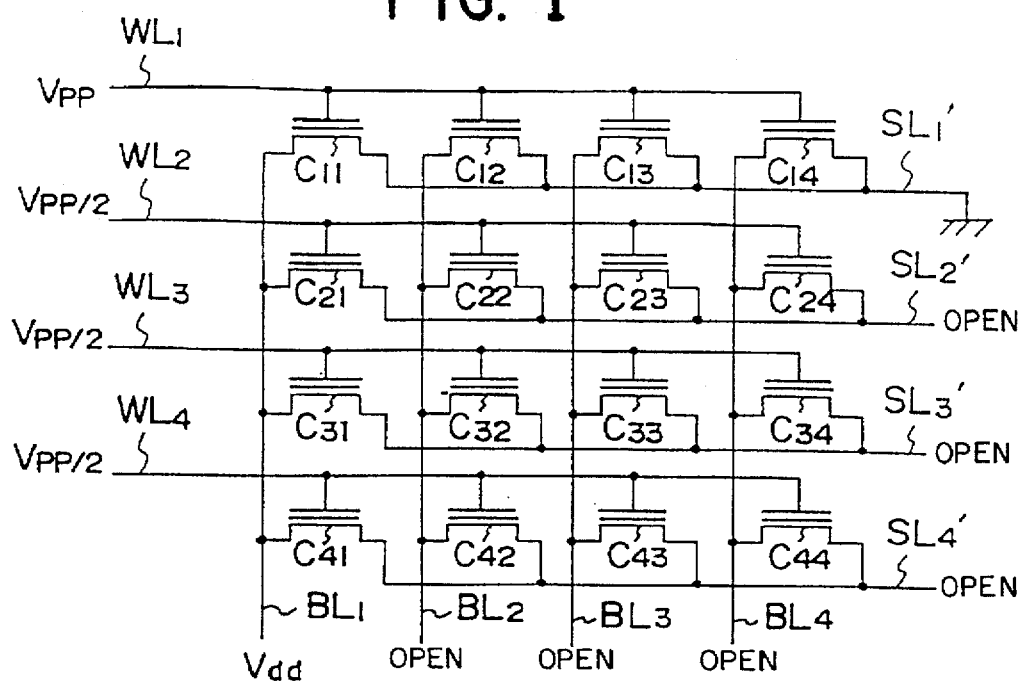
FIG. 1 is a circuit diagram indicative of a memory cell array of a non-volatile semiconductor memory device according to an embodiment of the present invention.
Figure 3:
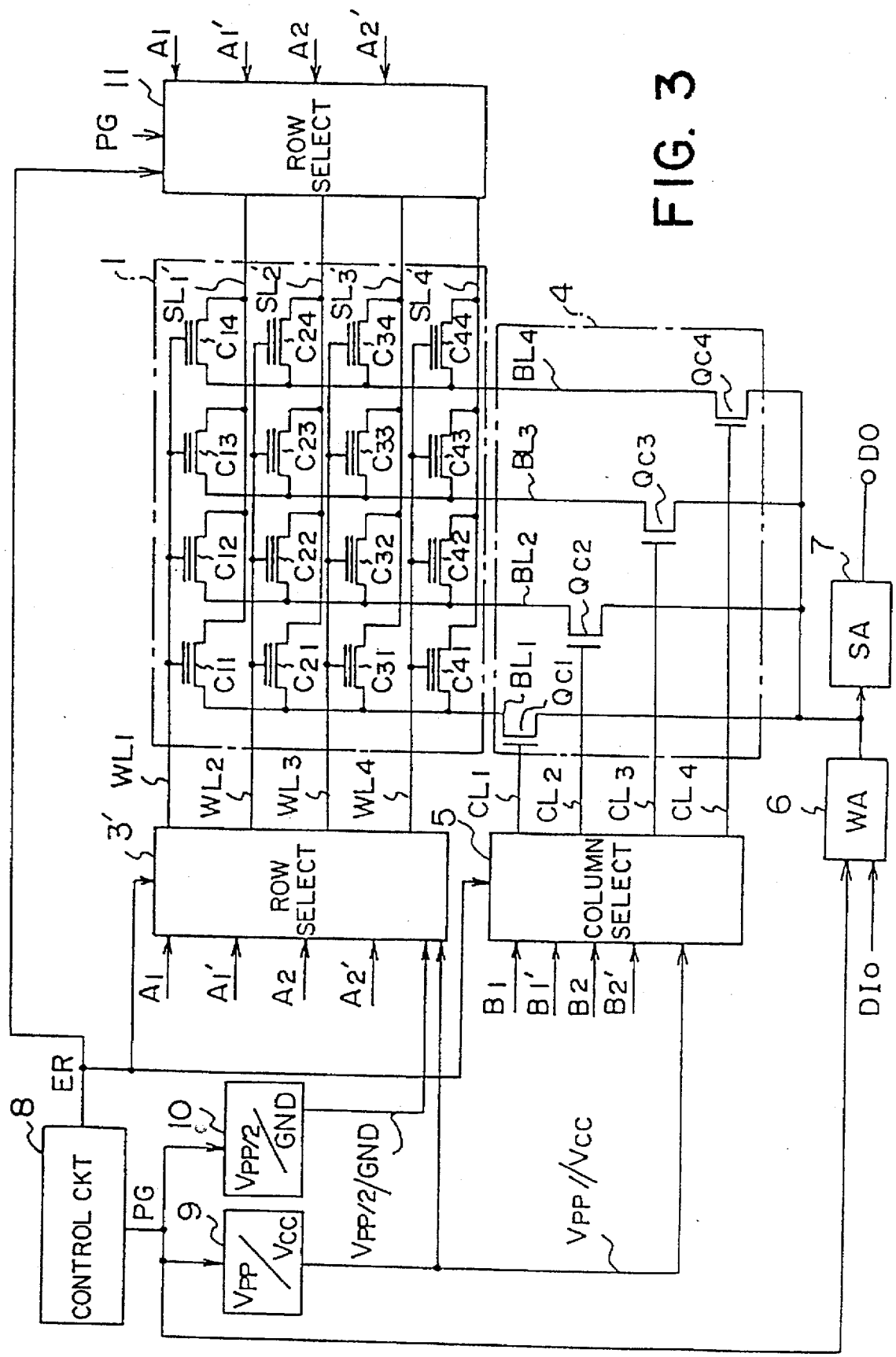
FIG. 3 is a circuit diagram of an embodiment of a non-volatile semiconductor memory device according to the embodiment of the present invention.

Referring now to FIG. 3, there is shown a circuit diagram showing an embodiment of a non-volatile semiconductor memory device according to the present invention. In this device, when the cell transistor C11 is subjected to programming, the respective word, bit and source lines WL, BL and SL are supplied such voltages as shown in FIG. 1. For this purpose, source lines $SL_1'$, $SL_2'$, $SL_3'$ and $SL_4'$ are provided in parallel to word lines $WL_1$, $WL_2$, $WL_3$ and $WL_4$, respectively. Further, in order to apply an intermediate voltage ($V_{pp}/2$ for example) to non-selected word lines as a drain disturb preventing voltage in a write mode, a voltage generator circuit 10 for generating the intermediate voltage $V_{pp}/2$ instead of GND is provided. Further, in order to separately control potentials of source lines $SL_1'$, $SL_2'$, $SL_3'$ and $SL_4'$, an additional row selection circuit 11 is provided in place of the source circuit 2 shown in FIG. 11.

First, the voltage generator circuit 10 and the line selection circuit 3' will be described.

Figure 4:
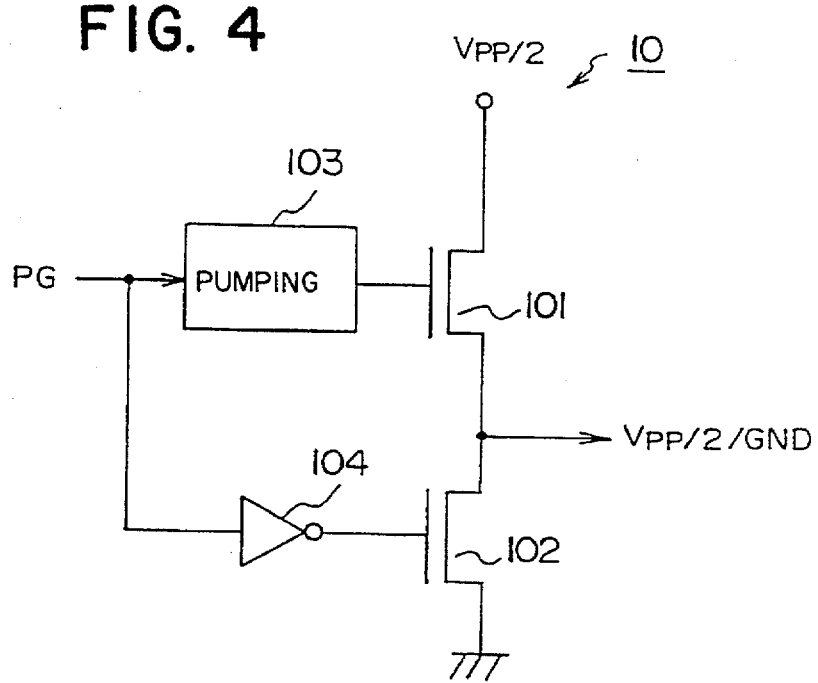
FIG. 4 is a detailed circuit diagram of a voltage generator circuit shown in FIG. 3.

FIG. 4 shows the voltage generator circuit 10 shown in FIG. 3 in detail. The voltage generator circuit 10 includes an N channel enhancement type transistor 101 connected to a voltage source $V_{pp}/2$ and an N channel depletion type transistor 102 connected to a voltage source $V_{cc}$. The transistor 101 is controlled by a pumping circuit 103 for generating a voltage higher than $V_{pp}/2$ and the transistor 102 is controlled by an inverter 104. The pumping circuit 103 and the inverter 104 are controlled by a program signal PG. Therefore, when PG="1", the transistor 101 is turned on, resulting in $V_{pp}/2/GND=V_{pp}/2$. On the other hand, when PG="0", the transistor 102 is turned on, resulting in $V_{pp}/2/GND=GND$.

Figure 5:
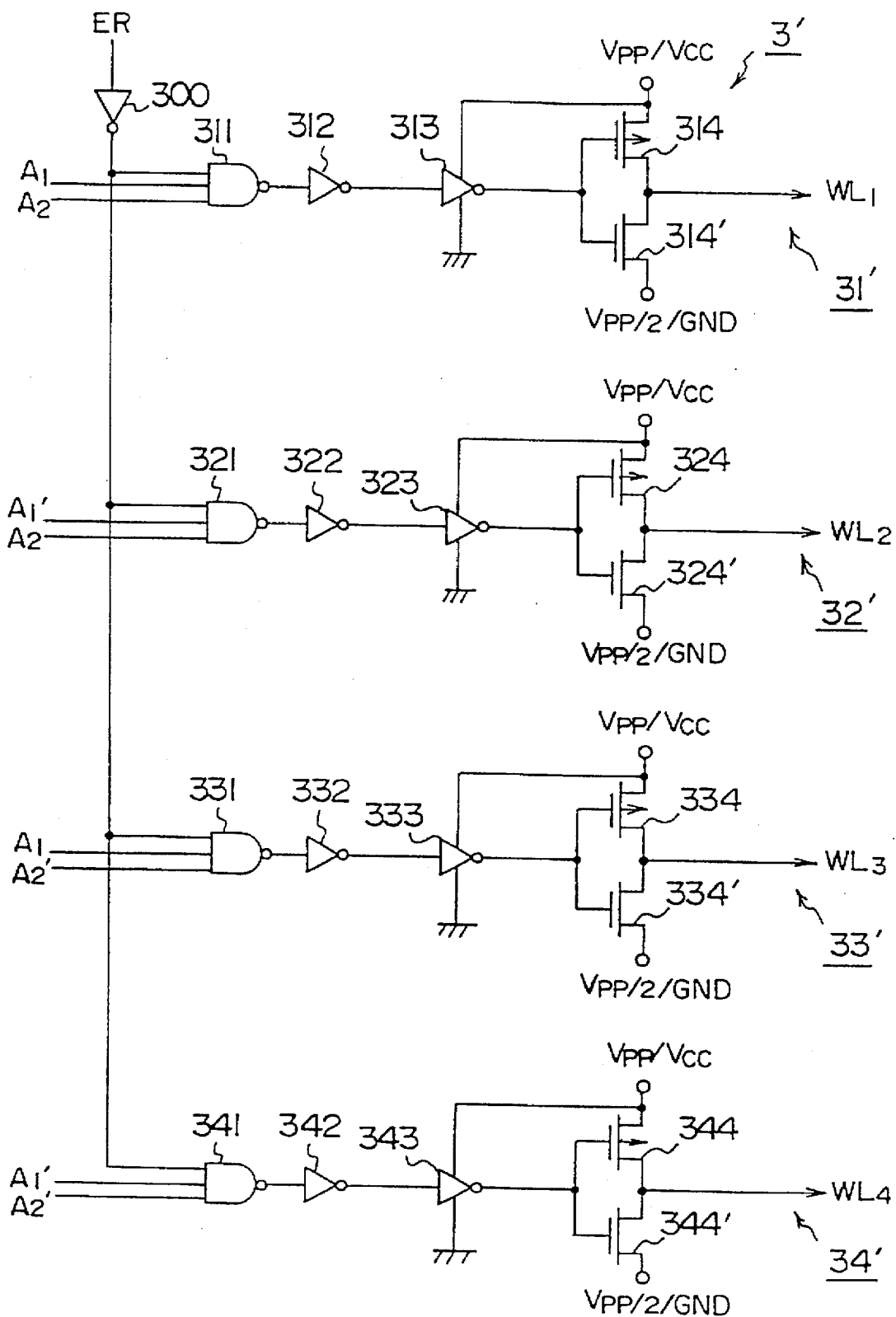
FIG. 5 is a detailed circuit diagram of a row selection circuit 3' shown in FIG. 3.

FIG. 5 shows the row selection circuit 3' in FIG. 3 in detail. The row selection circuit 3' is composed of NAND type logic circuits 31', 32', 33' and 34'. The NAND type logic circuits 31', 32', 33' and 34' includes N channel transistors 314', 324', 334' and 344', respectively, whose sources are connected to the output ($V_{pp}/2$ or GND) of the voltage generator 10. Therefore, in an erasing mode (ER="1"), all the NAND circuits 311, 321, 331 and 341 are disabled, so that the potentials of all the word lines $WL_1$, $WL_2$, $WL_3$ and $WL_4$ become GND.

On the other hand, in the programming mode (ER="0", PG="1"), an output of one of the inverters 312, 322, 332 and 342, for example, 312, becomes high level and outputs of three of the NAND circuits 311, 321, 331 and 341, for example, 321, 331 and 341, become high level. As a result, the transistor 314 is turned on and the potential of the word line $WL_1$ becomes $V_{pp}/V_{cc}=V_{pp}$. Further, the transistors 324', 334' and 344' are turned on and the potentials of the word lines $WL_2$, $WL_3$ and $WL_4$ become $V_{pp}/2/GND=V_{pp}/2$.

Similarly, in a read mode (ER="0", PG="0"), an output of one of the inverters 312, 322, 332 and 342, for example, 312, becomes high level and outputs of three of the NAND circuits 311, 321, 331 and 341, for example, 321, 331 and 341, become high level. As a result, the transistor 314 is turned on and the potential of the word line $WL_1$ becomes $V_{pp}/V_{cc}=V_{cc}$. Further, the transistors 324', 334' and 344' are turned on and the potentials of the word lines $WL_2$, $WL_3$ and $WL_4$ become $V_{pp}/2/GND=GND$.

Figure 15:
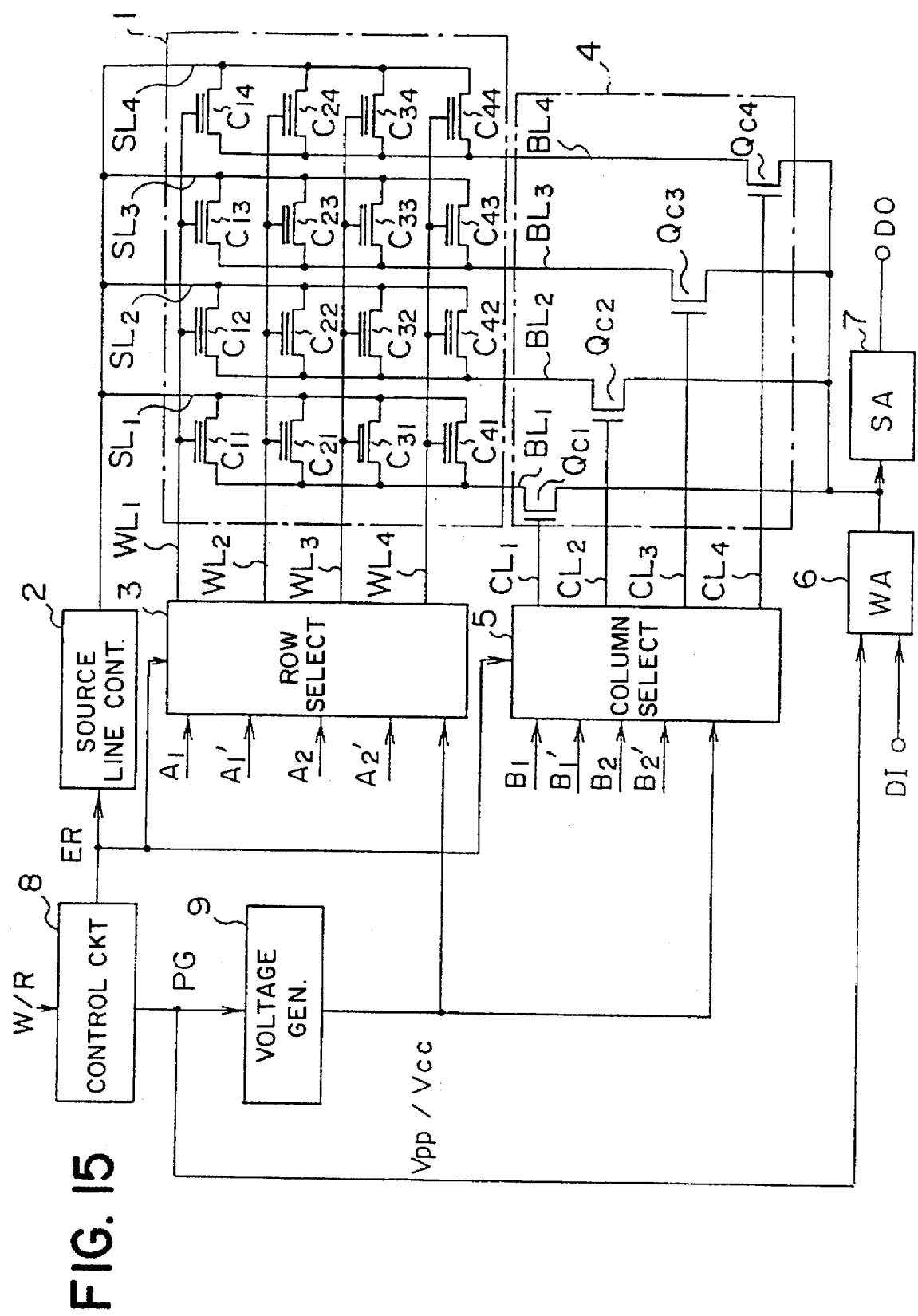
FIG. 15 is a circuit diagram showing a conventional non-volatile semiconductor memory device.
Figure 16:
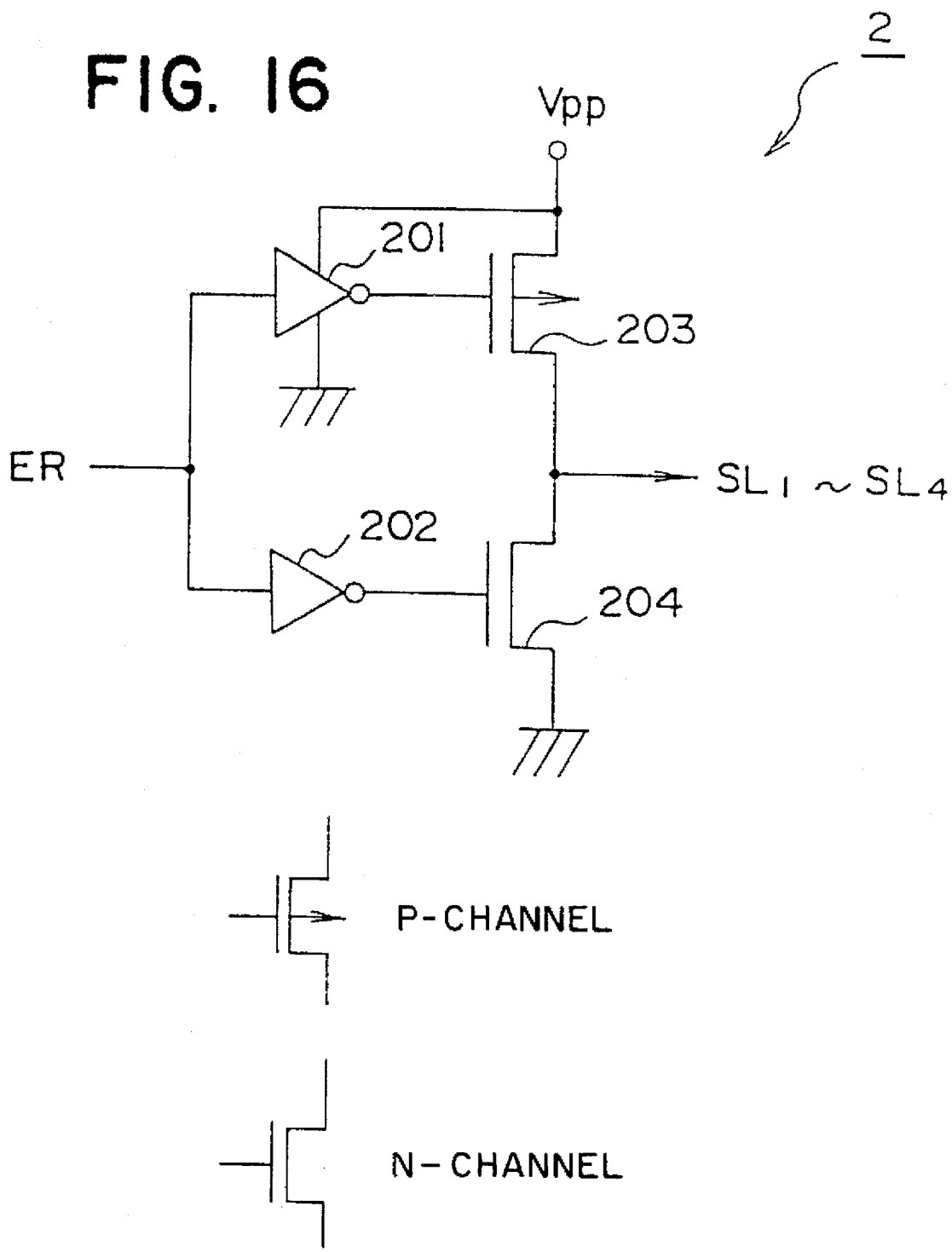
FIG. 16 is a detailed circuit diagram of a source circuit shown in FIG. 15.
Figure 17:
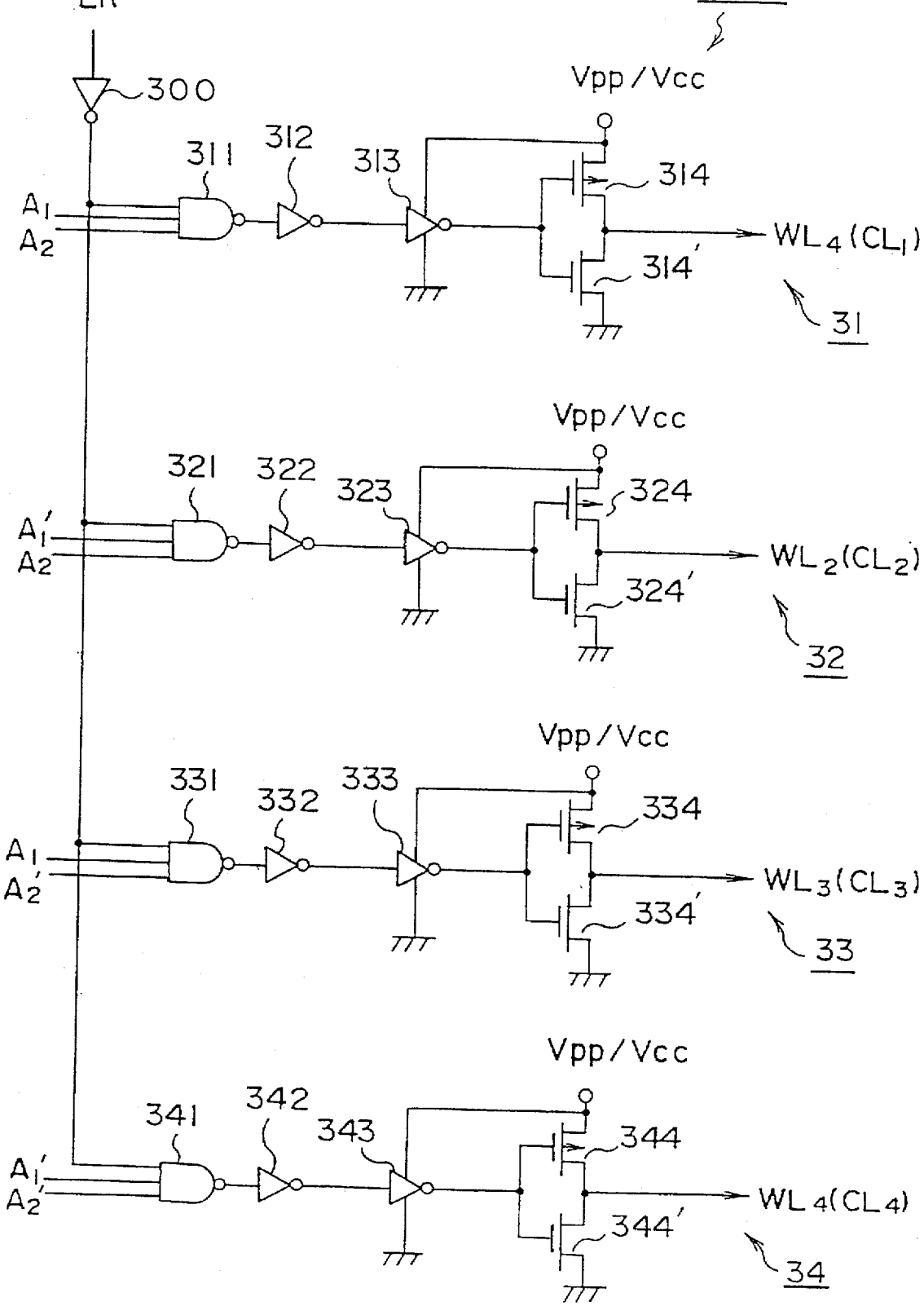
FIG. 17 is a detailed circuit diagram of a row selection circuit shown in FIG. 15.
Figure 18:
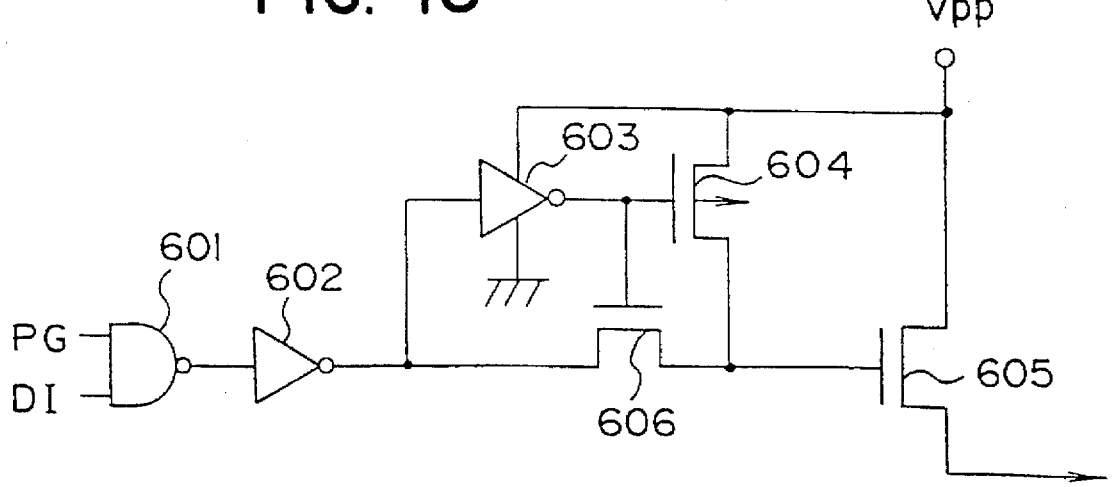
FIG. 18 is a detailed circuit diagram of a write amplifier shown in FIG. 15.
Figure 19:
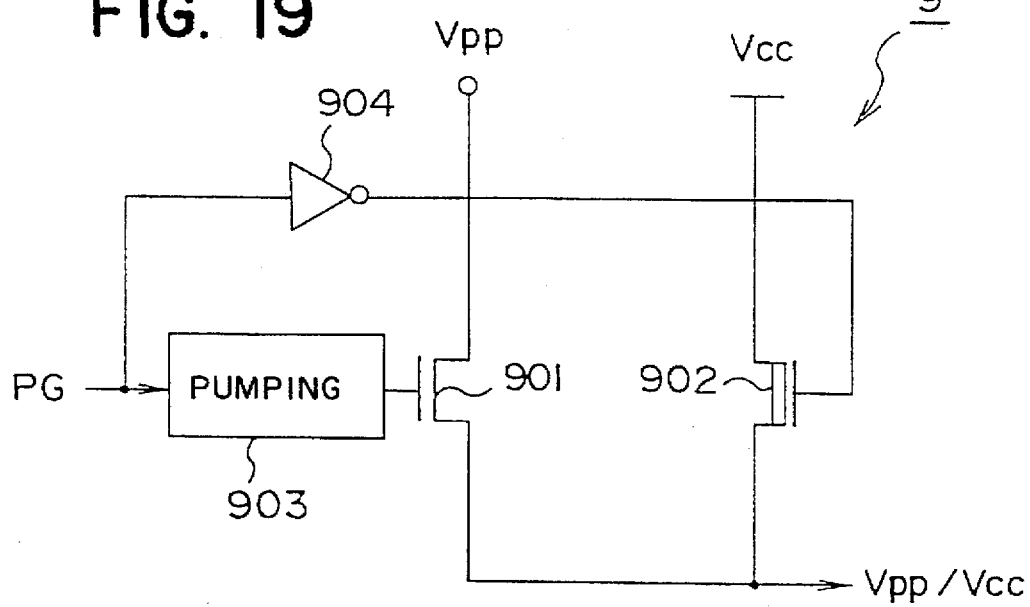
FIG. 19 is a detailed circuit diagram of a voltage generator circuit shown in FIG. 15.
Figure 20A:
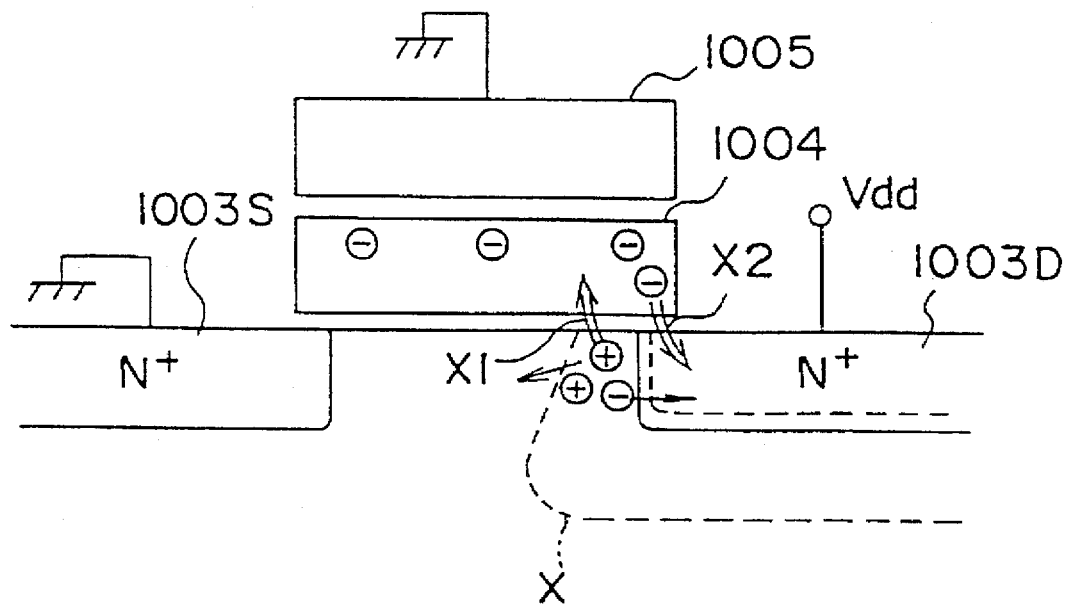
FIG. 20A and 20B are cross sections of the non-volatile semiconductor memory device shown in FIG. 15, for explaining generation of drain disturb phenomenon.
Figure 20B:
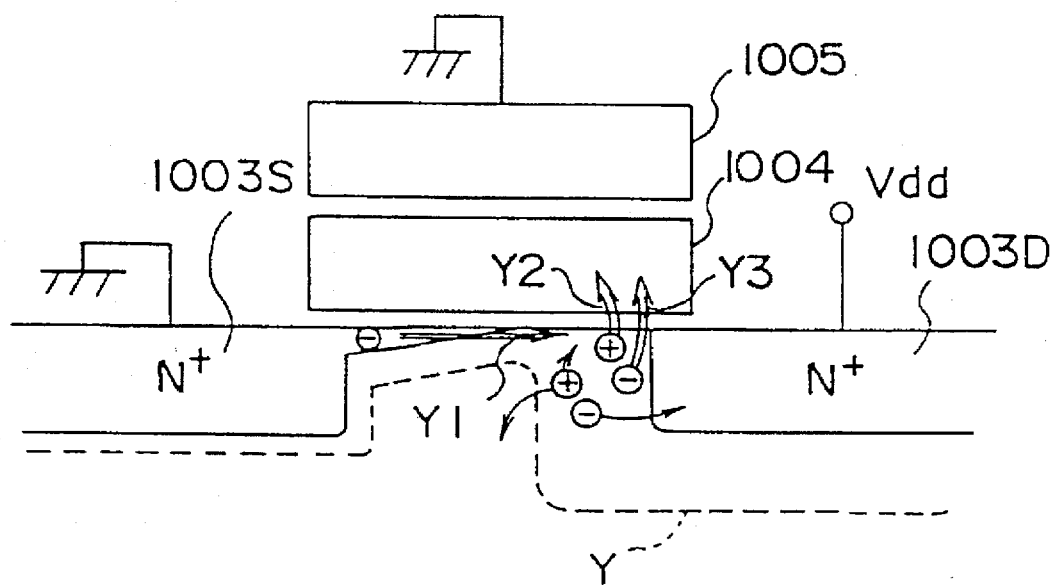
Figure 21:
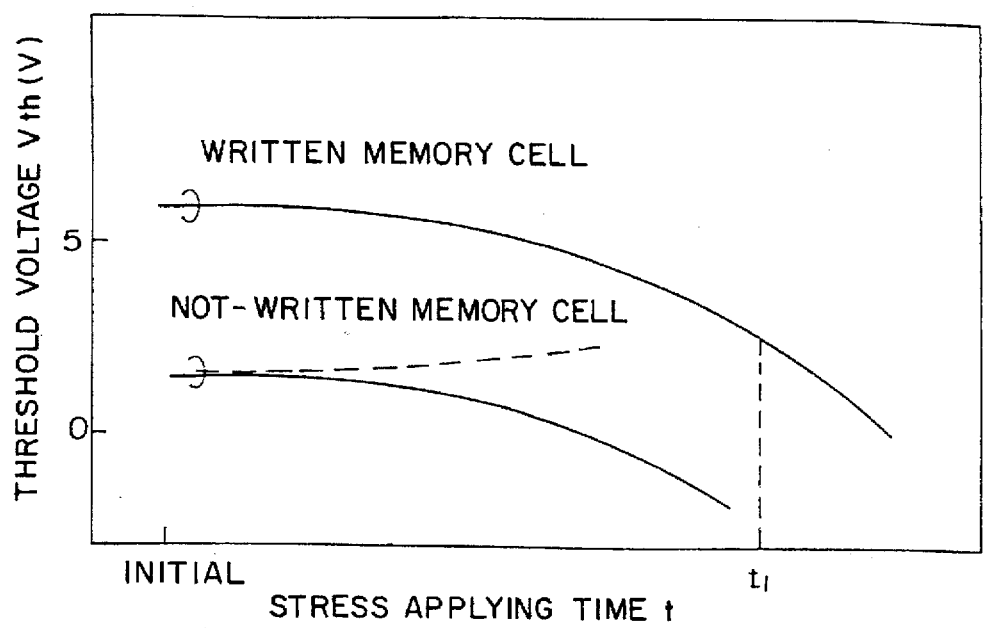
FIG. 21 is a graph showing an influence of drain disturb phenomenon on a threshold voltage characteristics.
Figure 22:
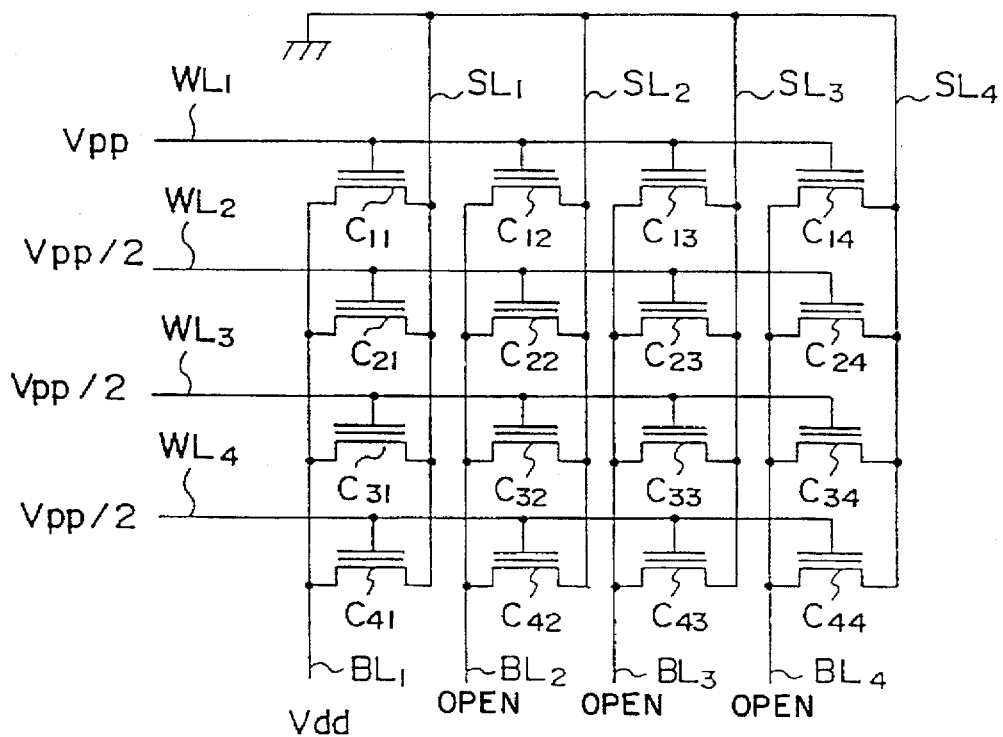
FIG. 22 shows a circuit diagram for implementing a conventional write method for preventing drain disturb.
Figure 23:
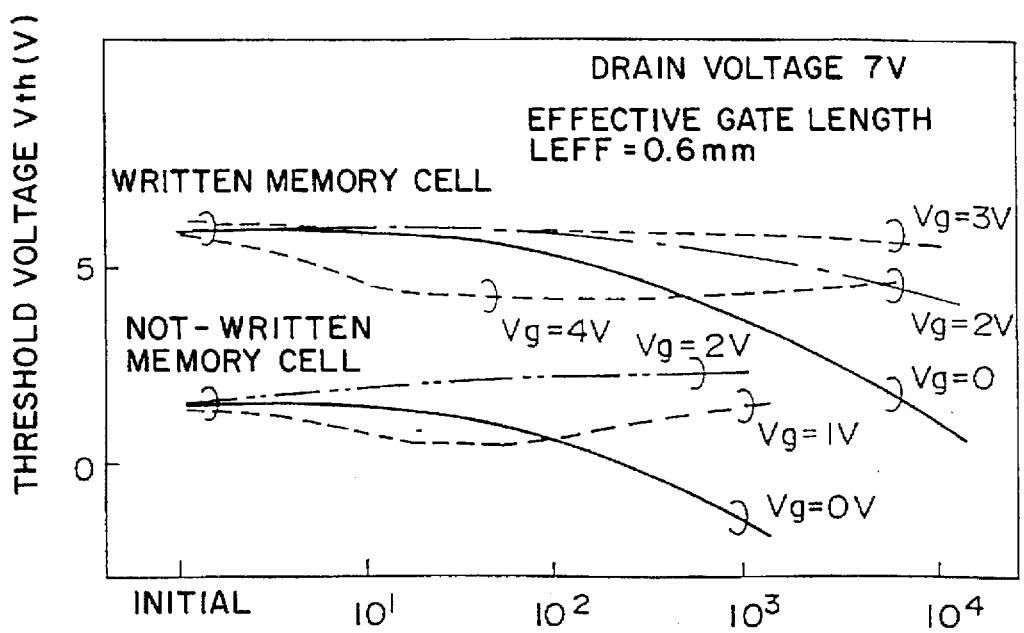
FIG. 23 is a graph showing a threshold voltage characteristics for explaining the problems to be solved by the present invention.
Figure 24:
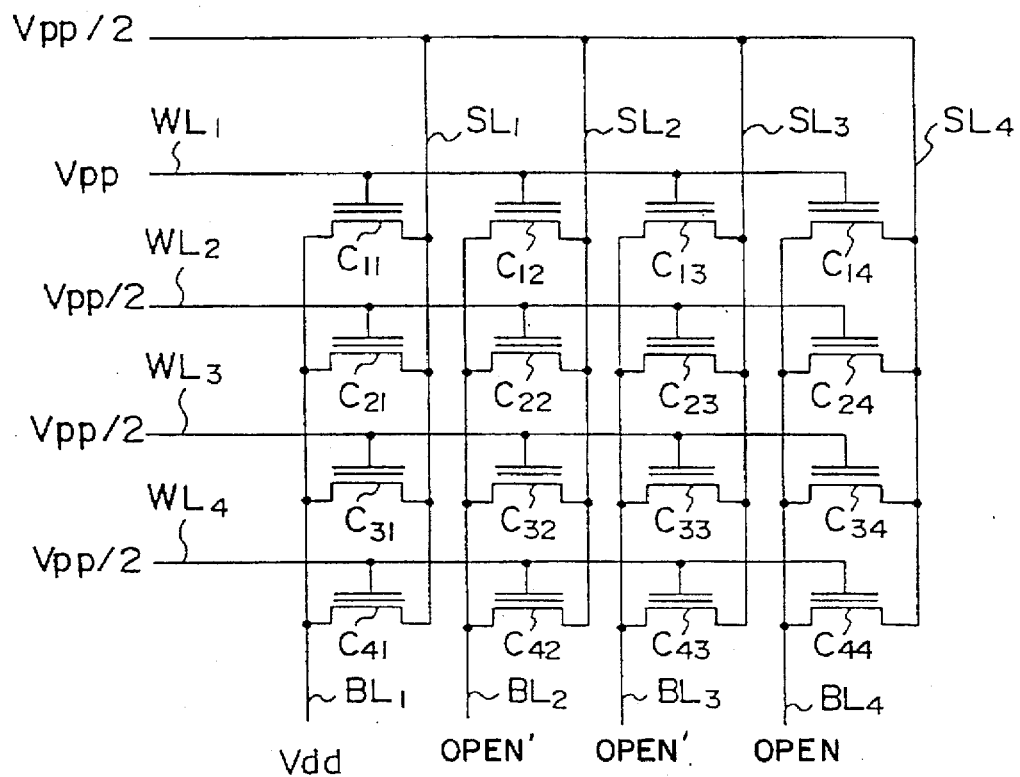
FIG. 24 shows another circuit diagram for implementing a conventional write method for preventing drain disturb.

Thus, the row selection circuit 3' shown in FIG. 3 operates similarly to the row selection circuit 3 shown in FIG. 15 in the erasing mode and the read mode. However, in the programming mode, the row selection circuit 3' operates to make the potential of a selected word line $V_{pp}$ and the potentials of the non-selected word lines $V_{pp}/2$.

Figure 6:
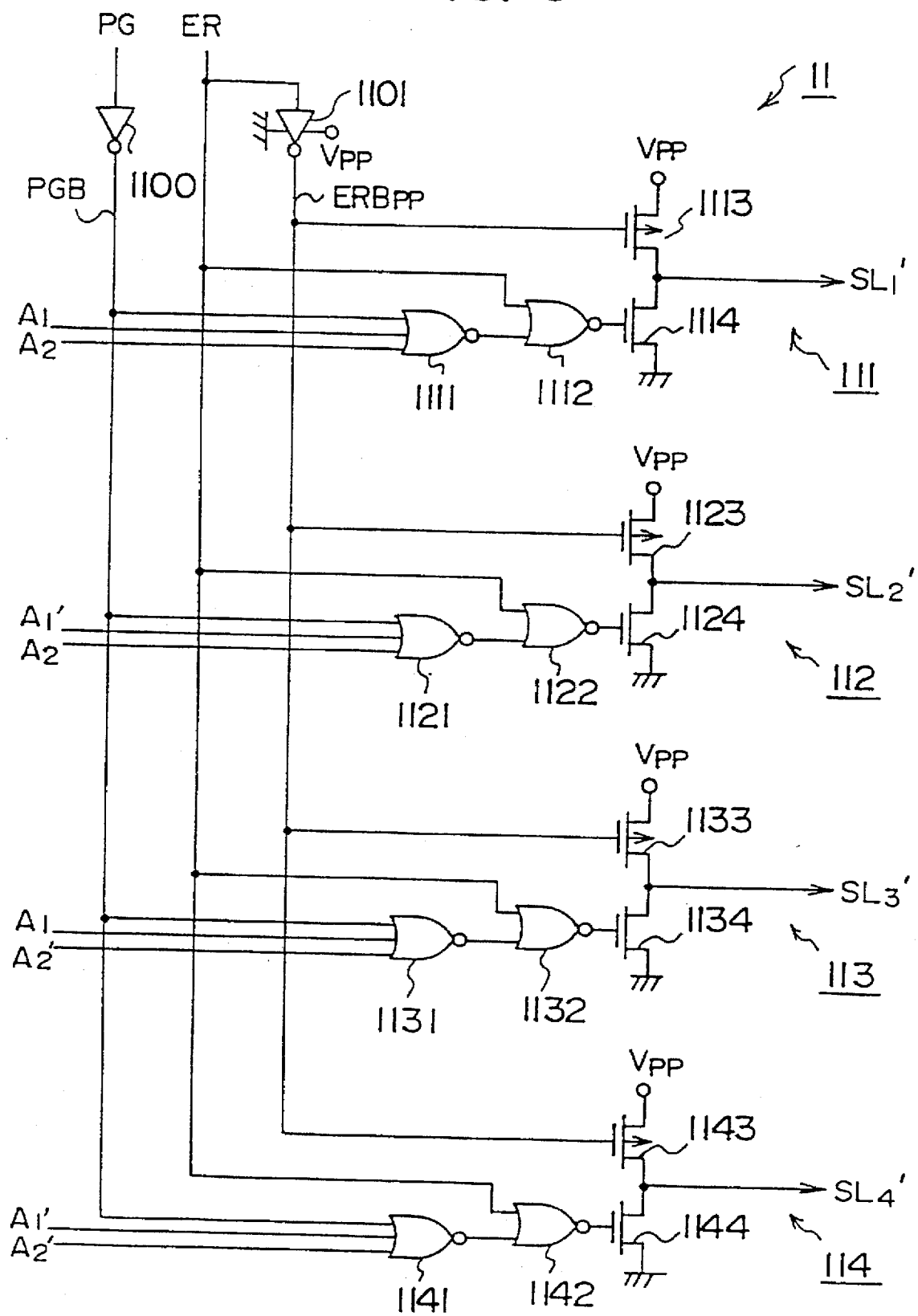
FIG. 6 is a detailed circuit diagram of a row selection circuit 11 shown in FIG. 3.

Referring to FIG. 6, the row selection circuit 11 includes unit circuits 111 to 114 provided for source lines $SL_1'$ to $SL_4'$, respectively. Since the circuits 111 to 114 are identical to one another, the description will be made on the circuit 111.

The circuit 111 includes a NOR gate 1111 receiving address signals $A_1$ and $A_2$ and a PGB signal, a NOR gate 1112 receiving the output of the gate 1111 and a erasing mode signal ER, a P-channel enhancement type transistor 1113 receiving a $ERB_{pp}$ signal, and an N-channel enhancement type transistor 1114 receiving the output of the gate 1112. The signal PGB is an inverted signal of the program signal PG by an inverter 1100, and the signal $ERB_{pp}$ is an output of an inverter 1101 receiving the erasing mode signal ER and operating on the $V_{pp}$ voltage.

The NOR gates 1111, 1121, 1131 and 1141 get enabled only in the write mode (PG=1, ER=0). In this mode, each of the transistors 1113, 1123, 1133 and 1143 are rendered non-conductive. Under this condition, if $A_1=A_2=1$, the transistor 1114 is turned ON and the transistors 1124, 1134 and 1144 are turned OFF. Accordingly, only the source line $SL_1'$ is brought into the GND level, and the remaining source lines $SL_2'$, $SL_3'$ and $SL_4'$ are brought into an open state.

In the erasing mode (PG=0, ER=1), each of the transistors 1113, 1123, 1133 and 1143 are made conductive, whereas the transistors 1114, 1124, 1134 and 1144 are all made non-conductive. Therefore, all the source lines $SL_1'$, $SL_2'$, $SL_3'$ and $SL_4'$ are driven to the $V_{pp}$ level.

In the read mode (PG=ER=0), all the transistors 1113, 1123, 1133 and 1143 are turned OFF and the transistors 1114, 1124, 1134 and 1144 are turned ON. Accordingly, each of the source lines SL' is driven to the GND level.

Figure 7A:
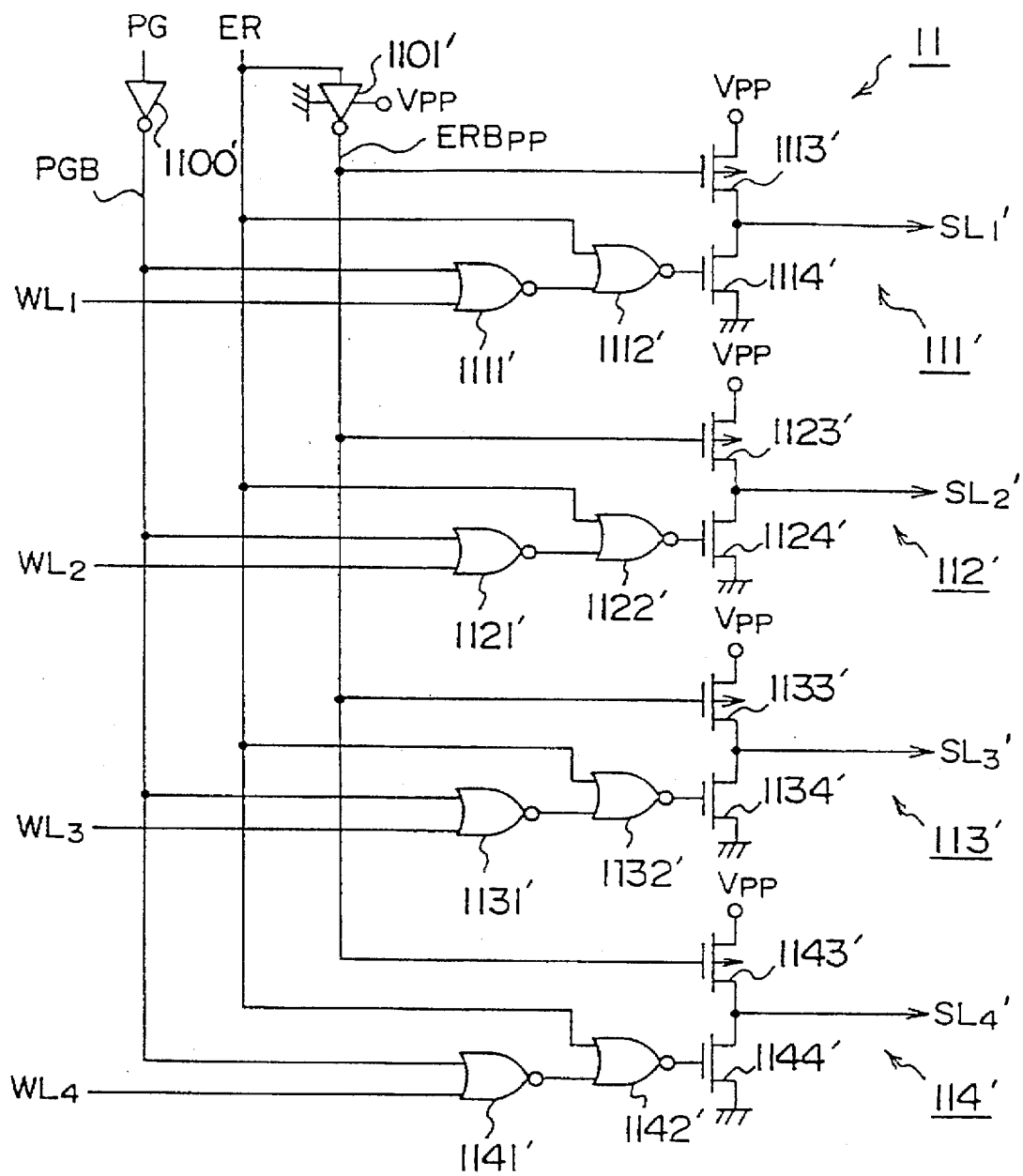
FIG. 7A and 7B are circuit diagrams of another example of a row selection circuit 11 shown in FIG. 3.

Turning to FIG. 7A, there is shown another circuit diagram of the row selection circuit 11. This circuit includes unit circuits 111' to 114' for the respective source lines $SL_1'$ to $SL_4'$. In the circuit 111', for example, there are provided a NOR gate 1111' receiving the signal PGB and the potential of the word line $WL_1$, a NOR gate 1112' receiving the output of the gate 1111' and the erasing mode signal ER, a P-channel enhancement transistor 1113' receiving the signal $ERB_{pp}$, and an N-channel enhancement transistor 1114' receiving the output of the gate 1112'. In this circuit, the transistor 1113' is connected between the source lines $SL_1'$ and the GND and controlled by the output of the NOR gate 1112'. In the write or programming mode, the selected word line is driven to the $V_{pp}$ level and the non-selected word lines are driven to the $V_{pp}/2$ level. The threshold level of each of the NOR gates 1111' to 1141' is designed to be an intermediate level between $V_{pp}$ and $V_{pp}/2$. As a result, by selecting the word line $WL_1$, only the source line $SL_1'$ is driven to the GND, whereas the remaining source lines $SL_2'$, $SL_3'$ and $SL_4'$ are brought into an open state.

Figure 7B:
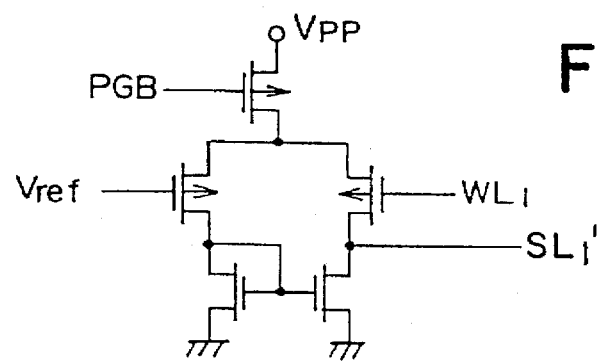

It is to be noted that each of the NOR gates 1111', 1121', 1131' and 1141' can be replaced with a comparator circuit as shown in FIG. 7B. Here, a reference voltage $V_{ref}$ is set as follows:

$$V_{pp}/2 < V_{ref} < V_{pp}$$

As mentioned, in the write mode, the potential of the selected source line is made GND and those of non-selected source lines are made in the open state by the source circuit 2' and the row selection circuit 11.

Figure 2A:
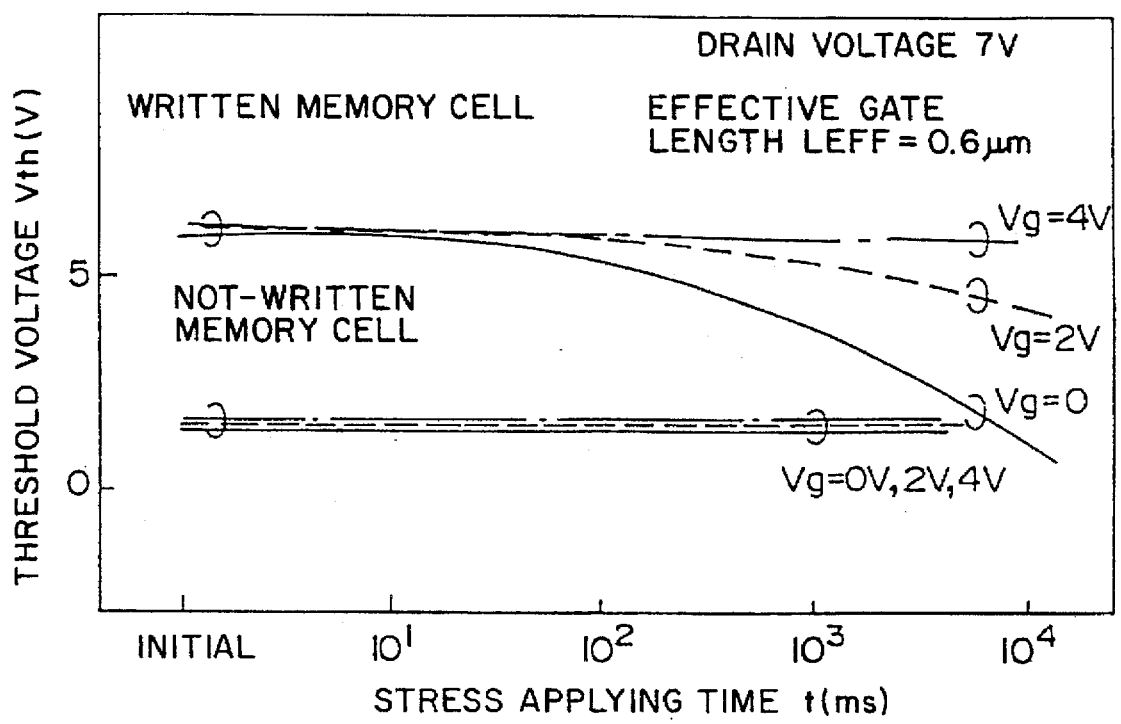
FIG. 2A and 2B are graphs showing a change in threshold voltage of the cell shown in FIG. 1.
Figure 2B:
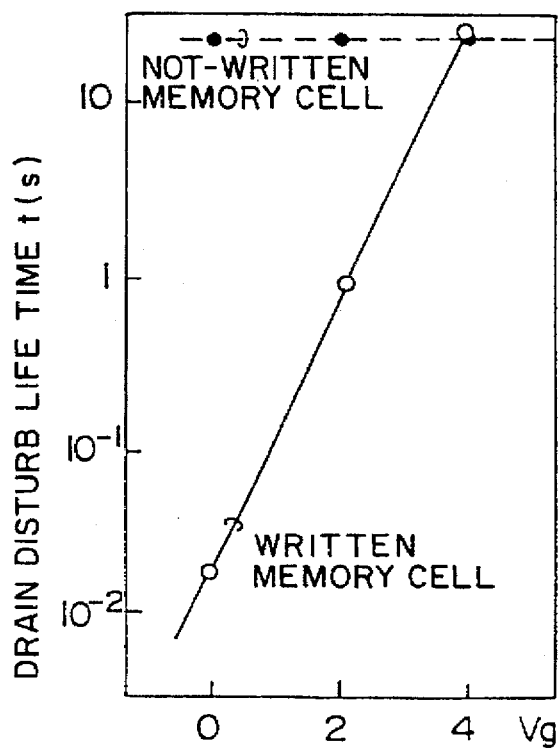

As a result, the electric characteristics of each memory cell transistor C are shown by FIGS. 2A and 2B. It is appreciated from FIG. 2 that this embodiment is improved in electric properties as compared to the prior art.

Although, in the described embodiment, the drain disturb preventing voltage is set to the intermediate voltage $V_{pp}/2$ which is a half of the high voltage $V_{pp}$, it may be set to the logic drive source voltage $V_{cc}$. Further, although, in the write mode, the drain disturb preventing voltage is applied to the non-selected word lines and the non-selected source lines are made in the open state, it is possible to prevent the drain disturb by making only the non-selected source lines open. In such case, the effect of drain disturb prevention may be not always sufficient. In the latter case, the voltage generator circuit 10 becomes unnecessary and the line selection circuit 3' is replaced by the line selection circuit 3 shown in FIG. 11. Further, it is, of course, possible to apply the present invention to a non-volatile semiconductor memory device including a memory cell array having other construction than 4×4 memory cells. Further, the present invention is particularly effective in a non-volatile semiconductor memory device having a tunnel insulating layer 60–200 Å thick which is sensitive to the drain disturb phenomenon.

Figure 8:
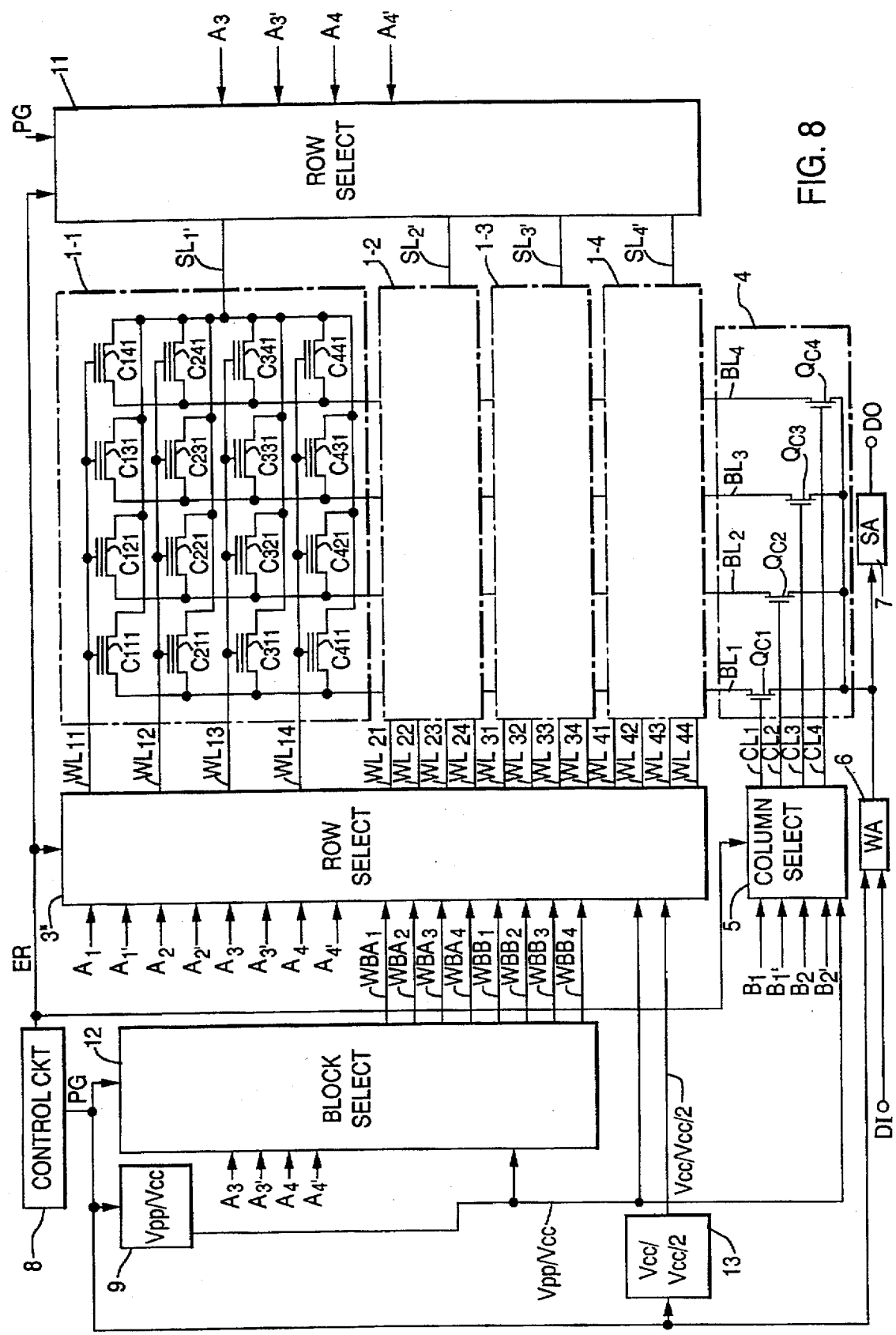
FIG. 8 is a circuit diagram indicative of another embodiment of the present invention.

Referring to FIG. 8, a memory device according to another embodiment of the present invention includes four memory cell arrays 1-1 to 1-4 which are identical in equivalent circuit to one another. The source lines in one cell array are connected in common to each other, so that four common source lines $SL_1'$ to $SL_4'$ are formed and connected to the row selection circuit 11. There is further provided a group selection circuit 12 to select, in a write mode, one of the cell array blocks 1-1 to 1-4. The outputs $WBA_1$ to $WBB_4$ of the block selection circuit 12 are supplied to a row selection circuit 3". Further, since the memory capacity is increased, additional address signals $A_3$, $A_3'$, $A_4$ and $A_4'$ are provided. In this embodiment, furthermore, the intermediate voltage for the drain disturb prevention voltage is set to be $V_{cc}/2$, so that there is provided a voltage generator 13 for generating, in the write mode, the $V_{cc}/2$ voltage is place of $V_{cc}$.

Figure 9:
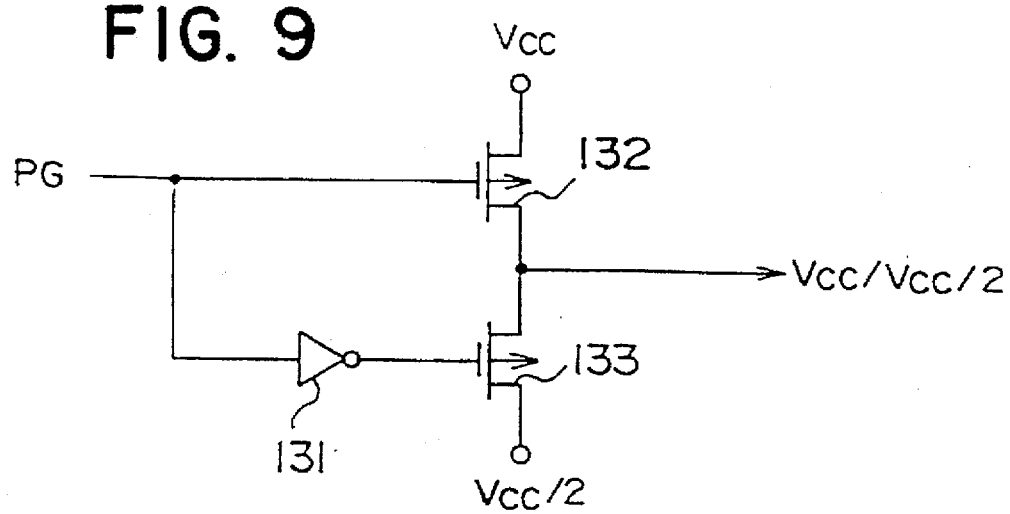
FIG. 9 is a circuit diagram of a voltage generator 13 shown in FIG. 8.
Figure 13:
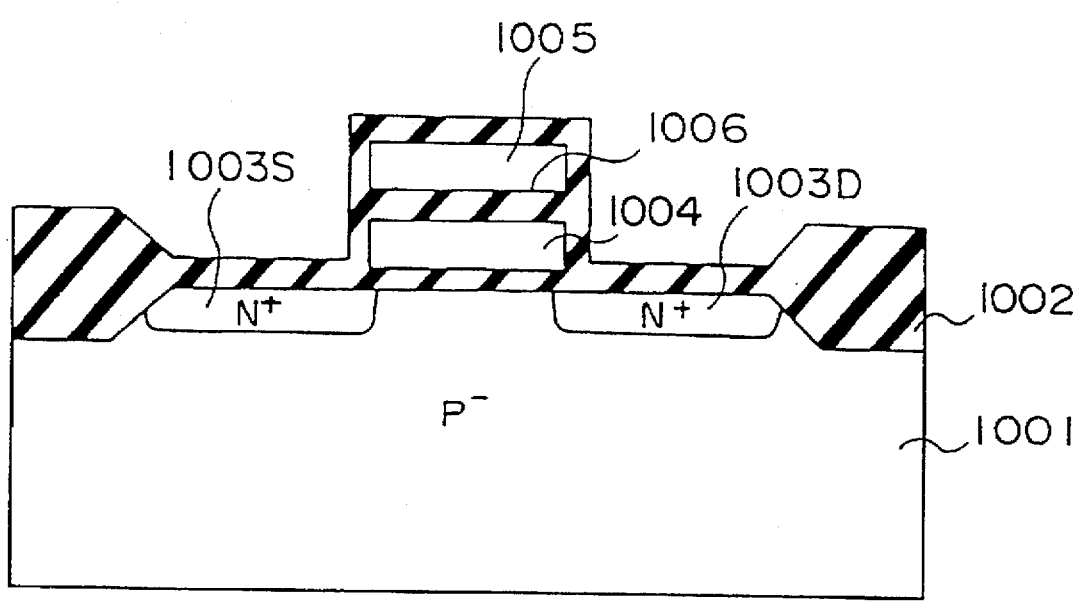
FIG. 13 is a cross section of an example of the non-volatile memory cell.

Turning to FIG. 9, the voltage generator 13 a p-channel transistor 132 receiving a programming signal PG, an inverter 131, and a P-channel transistor 133 receiving the output of the inverter 131. In the write mode (PG=1), the transistors 132 and 133 are turned OFF and ON, respectively, so that the output of the generator 13 takes the $V_{cc}/2$ level.

In the modes other than the write mode (PG=0), the transistors 132 and 133 are turned ON and OFF, respectively. Therefore, the generator 13 generates the $V_{cc}$ level.

Figure 10:
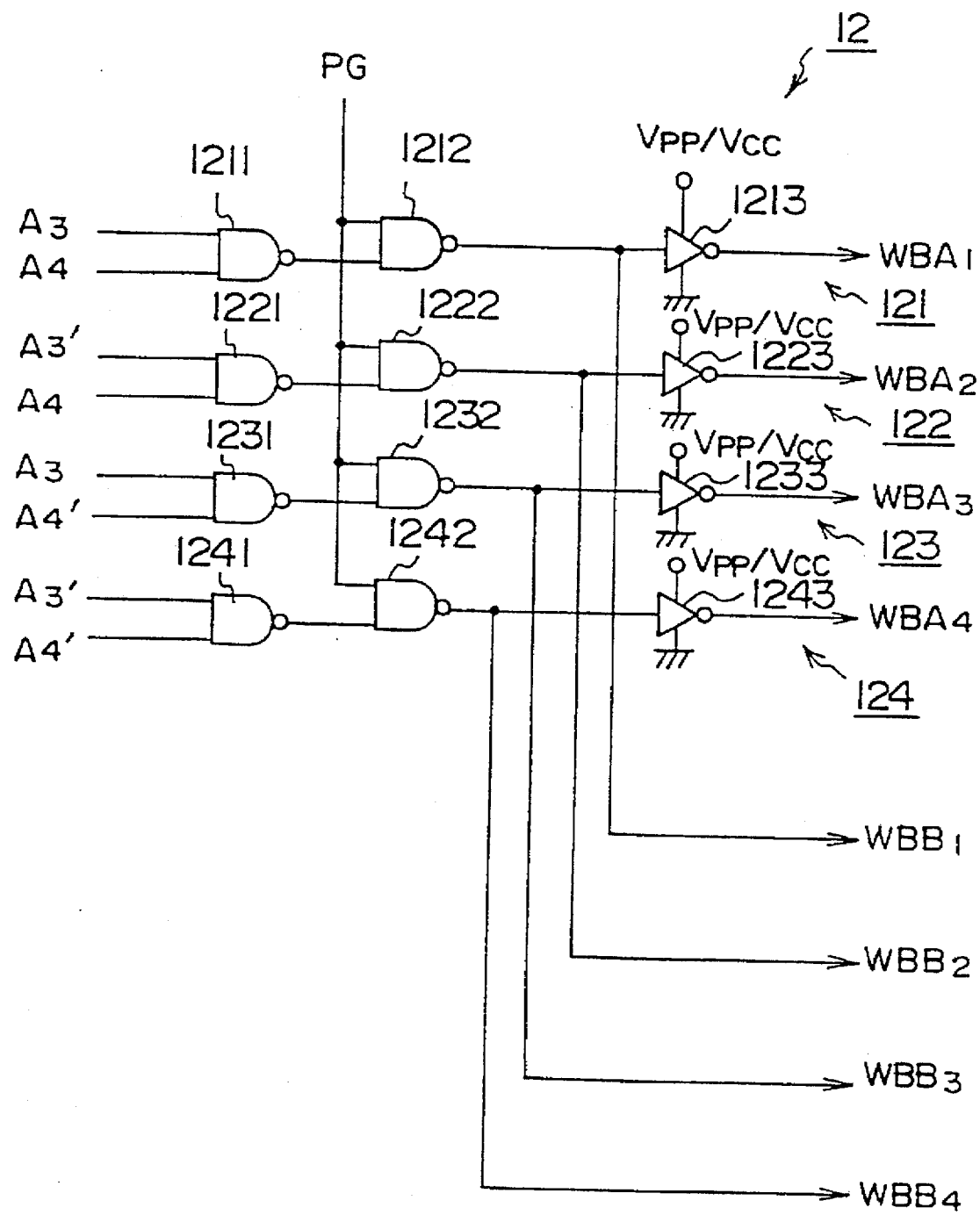
FIG. 10 is a circuit diagram of a block selection circuit 12 shown in FIG. 8.

Referring to FIG. 10, the block selection circuit 12 includes NAND type logic circuits 121 to 124. For example, the circuit 121 includes a NAND gate 1211 receiving the address signals A3 and A4, a NAND gate 1212 receiving the output of the gate 1211 and the program signal PG, and an inverter 1213 operating on the $V_{pp}/V_{cc}$ level. The NAND gate 1212 is activated only in the write mode (PG=1). In addition, one of the NAND gates 1211 to 1241, the NAND gate 1211 for example, produces the low level output, and the remaining NAND gates produce the high level output. Accordingly, it is obtained that $WBA_1$=low level, $WBB_1$=high level, $WBA_2$=$WBA_3$=$WBA_4$=high level, and $WBB_2$=$WBB_3$=$WBB_4$=low level, which are in turn supplied to the row selection circuit 3". In the modes other than the write mode, there is obtained $WBA_1$=$WBA_2$=$WBA_3$=$WBA_4$=low level and $WBB_1$=$WBB_2$=$WBB_3$=$WBB_4$=high level.

Figure 11:
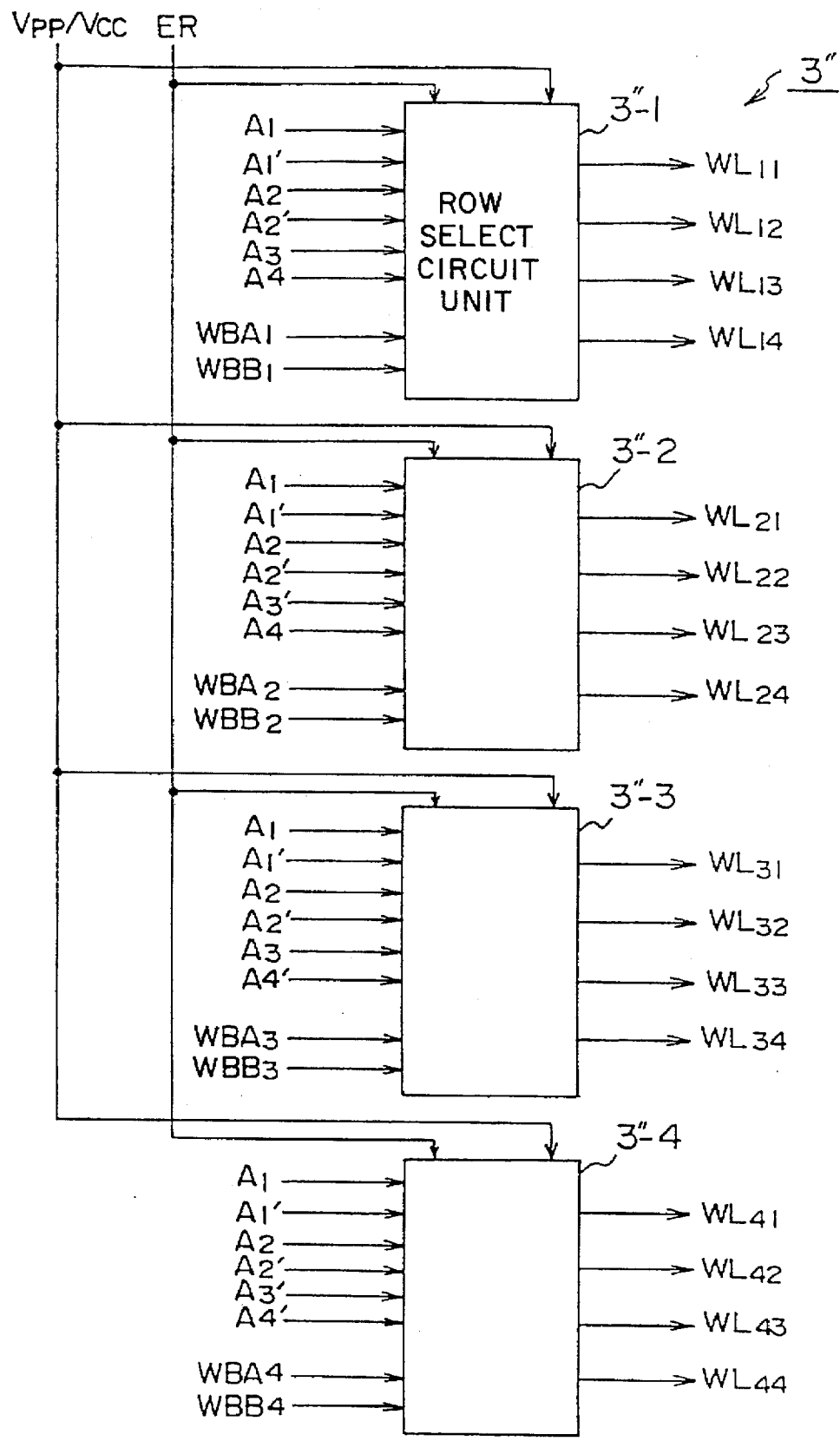
FIG. 11 is a block diagram of a row selection circuit 3" shown in FIG. 8.

Turning to FIG. 11, the row selection circuit 3" includes four row selection units 3"-1 to 3"-4, which receive the outputs of the block selection circuit 4 as shown in the drawing, in addition to the associated address signals A as shown therein. Thus, the row selection unit 3"-1 as one example controls the word lines $WL_{11}$ to $WL_{14}$ in response to the signals A, WBA and WBB as shown in FIG. 11.

Figure 12:
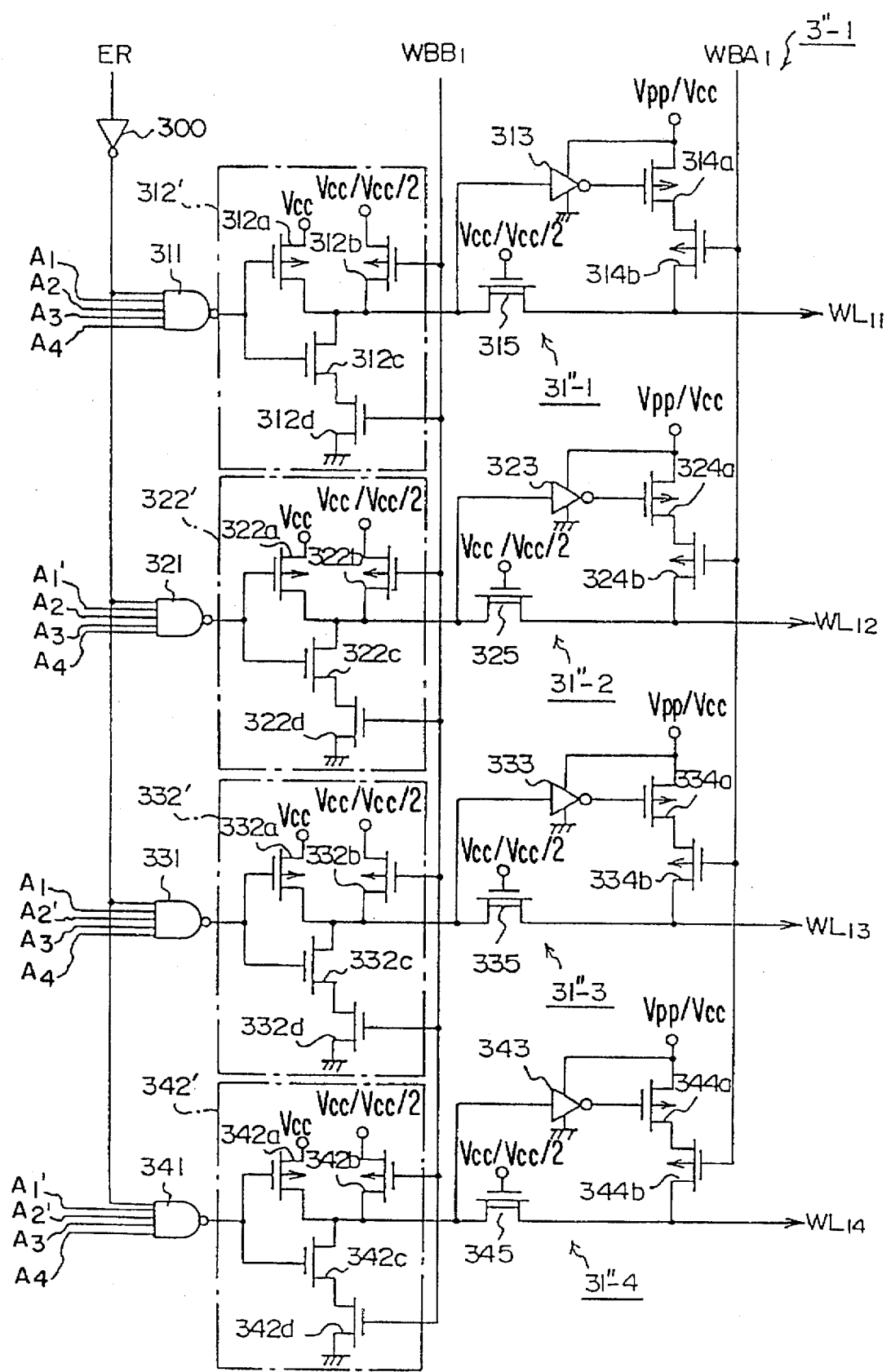
FIG. 12 is a circuit diagram of a unit circuit 3"-1 shown in FIG. 11.
Figure 14A:
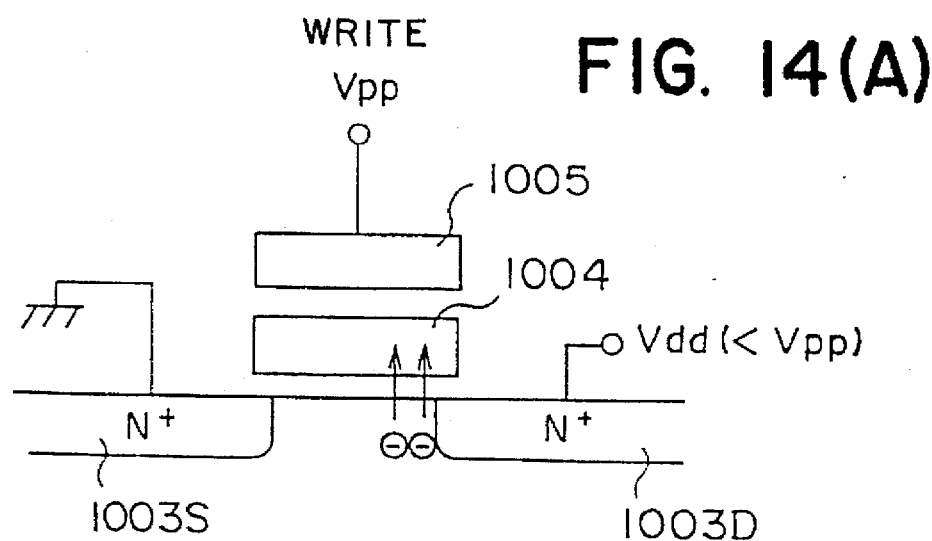
FIG. 14A, 14B and 14C are cross sections of the memory cell shown in FIG. 13, for explaining an operation thereof.
Figure 14B:
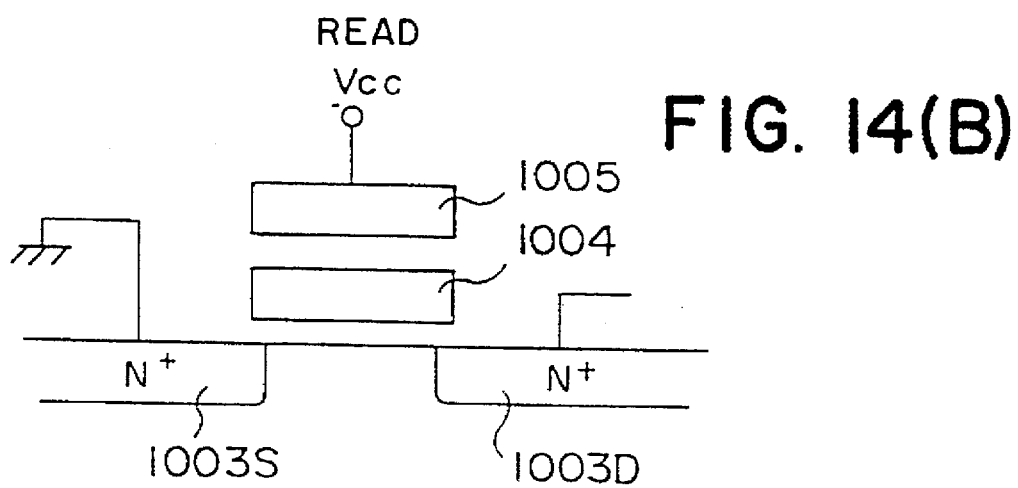
Figure 14C:
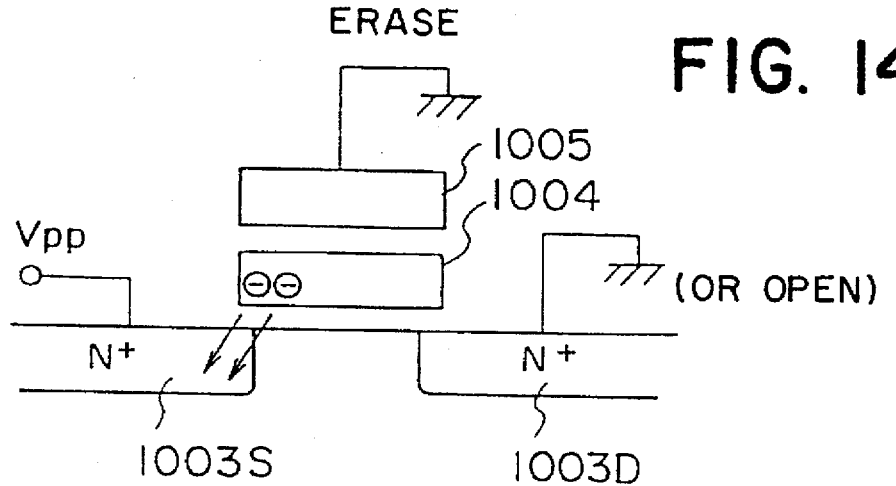

As shown in FIG. 12, for example, the row selection unit 3"-1 includes four NAND type logic circuit 31"-1 to 31"-4. As a typical example, the circuit 31"-1 includes a NAND gate 311 receiving the address signals $A_1$ to $A_4$, a NAND gate 312' receiving the output of the gate 311 and the block selection signal $WBB_1$, having transistors 312a, 312b, 312c and 312d and operating on $V_{cc}$ and $V_{cc}/2$ voltages, an inverter 313 receiving the output of the gate 312' and operating on $V_{pp}/V_{cc}$ level a transistor 314a receiving the output of the inverter 313, a transistor 314b receiving the block selection signal $WBA_1$, and an N-channel depletion transistor 315 connected between the output of the gate 312' and the word line $WL_1$ and further connected at its gate to the $V_{cc}/V_{cc}/2$. The NAND gates 311 to 341 receives the inverted signal of the erasing mode signal ER, and hence those outputs take the high level in the erasing mode (ER=1). Since the signals $WBA_1$ and $WBB_1$ are the low level and the high level, respectively, as mentioned above, each of the word lines $WL_{11}$ to $WL_{14}$ is driven to the GND. Similarly, all the remaining word lines WL controlled by the other circuits 3"-2 to 3"-4 are also driven to the GND level.

In the write mode (PG=1), if the address signals $A_1$ to $A_4$ are all at the high level, the output of the NAND gate 311 is at the low level and the outputs of the NAND gates 321 to 341 are at the high level. Further, in the operation example as mentioned above, the signals $WBA_1$ and $WBB_1$ are at the low level and the high level, respectively. Accordingly, the outputs of the NAND gates 312' to 342' takes $V_{cc}$, GND, GND, and GND, respectively. The transistors 314a and 314b are thereby turned ON to drive the word line $WL_{11}$ to the $V_{pp}$ level. On the other hand, the transistors 324a, 334a and 344a are all turned OFF to drive the word lines $WL_{12}$ to $WL_{14}$ to the GND level. For the remaining word lines WL, it will be understood form the above description that they are driven to the $V_{cc}/2$ level. Thus, the selected one word and the non-selected word lines in the selected cell array block are driven to the $V_{pp}$ level and the GND level, respectively, and all the word lines in the non-selected cell array block are driven to the $V_{cc}/2$ level.

Turning back to FIG. 8, the additional row selection circuit 11 responds to the address signals $A_3$, $A_3'$, $A_4$ and $A_4'$ and controls the levels of the source lines SL' independently of each other. That is, in the write mode (PG=1, ER=0), the source line SL for the selected cell array block is driven to the GND level and the source lines for the non-selected cell array blocks are brought into an open state.

What is claimed is:

1. A semiconductor memory device comprising:

a plurality of word lines;

a plurality of source lines;

a plurality of bit lines;

a plurality of memory cells each connected to an associated one of said word lines, an associated one of said source lines, and an associated one of said bit lines;

a first row selection circuit supplying, in a write mode, at least one of said word lines with a first voltage and remaining ones of said word lines with a second voltage;

a column selection circuit supplying, in the write mode, one of said bit lines with a third voltage and bringing remaining ones of said bit lines into one of a ground level state and an open state; and a second row selection circuit supplying, in the write mode, at least one of said source lines with a fourth voltage and bringing remaining ones of said source lines into an open state, said third voltage being different from each of said first, second and fourth voltages, said second voltage being not equal to each of said first voltage and said ground level and taking an intermediate level between said first voltage and said ground level.

2. The memory device as claimed in claim 1, wherein said first voltage is in a range of 6–12 V, said second voltage being in a range of 0.4–6 V, and said third voltage being in a range of 3–8 V, and said fourth voltage is about 0 V.

3. The memory device as claimed in claim 1, wherein said first row selection circuit supplies, in an erasing mode, each of said word lines with said fourth voltage.

4. The memory device as claimed in claim 1, wherein said second row selection circuit includes logic circuits each connected to an associated one of said word lines to provide outputs corresponding to logics of potentials of said word lines and a write mode signal, and switching elements connected between different ones of said word lines and a voltage source of said fourth voltage, said switching elements being adapted to turn on or off in response to the outputs of said logic circuits.

5. The memory device as claimed in claim 1, wherein said second row selection circuit includes determination circuits connected to different ones of said word lines, for determining whether or not the potential of the word line is higher than a reference voltage between said first voltage and said second voltage, and switching elements connected between different ones of said word lines and a voltage source of said fourth voltage, said switching elements being adapted to turn on or off in response to the outputs of said determination circuits.

6. A semiconductor memory device comprising:

a plurality of word lines;

a plurality of source lines extending in parallel to said word lines;

a plurality of bit lines;

a plurality of memory cells arranged in a matrix form having a plurality of rows and a plurality of columns, the memory cells of one of said rows being connected to an associated one of said word lines and to an associated one of said source lines and being disconnected from remaining ones of said word lines and from remaining ones of said source lines, the memory cells of one of said columns being connected to an associated one of said bit lines and disconnected from remaining ones of said bit lines;

a first row selection circuit supplying, in a write mode, at least one of said word lines with a first voltage and remaining ones of said word lines with a second voltage lower than said first voltage;

a column selection circuit supplying, in the write mode, one of said bit lines with a third voltage and bringing remaining ones of said bit lines into one of a ground level state and an open state; and a second row selection circuit supplying, in the write mode, one of said source lines with a fourth voltage and bringing remaining ones of said source lines into an open state.

7. The memory device as claimed in claim 6, wherein said first voltage is in a range of 6–12 V, said second voltage is about 0 V and said third voltage is in a range of 3–8 V.

8. The memory device as claimed in claim 6, wherein said first row selection circuit supplying, in an erase mode, each of said word lines with said second voltage.

9. The memory device as claimed in claim 6, wherein said second row selection circuit includes logic circuits connected to different ones of said word lines, for providing outputs corresponding to logics of potentials of the word lines and a write mode signal, and switching elements connected between the word lines and a voltage source of said fourth voltage, said switching elements being adapted to turn on or off in response to the outputs of said logic circuits.

10. The memory device as claimed in claim 6, wherein said second row selection circuit includes determination circuits connected to different ones of said word lines, for determining whether or not the potential of the word line is higher than a reference voltage between said first voltage and said second voltage, and switching elements connected between different ones of said word lines and a voltage source of said fourth voltage, said switching elements being adapted to turn on or off in response to the outputs of said determination circuits.

11. A semiconductor memory device comprising:

a plurality of memory cell blocks, each of said blocks including a plurality of word lines, a plurality of bit lines, a common source line, and a plurality of memory cells each connected to an associated one of said word lines, an associated one of said bit lines, and said common source line; and a selection circuit for selecting one of said memory cell blocks, supplying a first voltage to one of said word lines in said one of said memory cell blocks, a second voltage substantially equal to a ground level voltage to said common source line in said one of said memory cell blocks and a third voltage to remaining ones of said word lines in said one of said memory cell blocks and to each of said word lines in each of remaining ones of said memory cell blocks, and for bringing each of the common source lines in said remaining ones of said memory cell blocks into an open state, said third voltage being an intermediate level between said first voltage and said second voltage.

12. The device as claimed in claim 11, wherein said first voltage is in a range of 5 to 12 V and said third voltage is in a range of 0.4 to 6 V.

13. A semiconductor memory device comprising:

a plurality of word lines;

a plurality of source lines;

a plurality of bit lines;

a plurality of memory cells each connected to an associated one of said word lines, an associated one of said source lines, and an associated one of said bit lines;

a first row selection circuit supplying, in a write mode, at least one of said word lines with a first voltage and remaining ones of said word lines with a second voltage;

a column selection circuit supplying, in the write mode, one of said bit lines with a third voltage and bringing remaining ones of said bit lines into one of a ground level state and an open state; and a second row selection circuit supplying, in the write mode, at least one of said source lines with a fourth voltage and bringing remaining ones of said source lines into an open state, said third voltage being different from each of said first, second and fourth voltages, wherein said first voltage is in a range of 6–12 V, said second voltage being in a range of 0.4–6 V, and said third voltage being in a range of 3–8 V, and said fourth voltage is about 0 V.

14. A semiconductor memory device comprising:

a plurality of word lines;

a plurality of source lines;

a plurality of bit lines;

a plurality of memory cells each connected to an associated one of said word lines, an associated one of said source lines, and an associated one of said bit lines;

a first row selection circuit supplying, in a write mode, at least one of said word lines with a first voltage and remaining ones of said word lines with a second voltage;

a column selection circuit supplying, in the write mode, one of said bit lines with a third voltage and bringing remaining ones of said bit lines into one of a ground level state and an open state; and a second row selection circuit supplying, in the write mode, at least one of said source lines with a fourth voltage and bringing remaining ones of said source lines into an open state, said third voltage being different from each of said first, second and fourth voltages, wherein said second row selection circuit includes logic circuits each connected to an associated one of said word lines to provide outputs corresponding to logics of potentials of said word lines and a write mode signal, and switching elements connected between different ones of said word lines and a voltage source of said fourth voltage, said switching elements being adapted to turn on or off in response to the outputs of said logic circuits.

15. A semiconductor memory device comprising:

a plurality of word lines;

a plurality of source lines;

a plurality of bit lines;

a plurality of memory cells each connected to an associated one of said word lines, an associated one of said source lines, and an associated one of said bit lines;

a first row selection circuit supplying, in a write mode, at least one of said word lines with a first voltage and remaining ones of said word lines with a second voltage;

a column selection circuit supplying, in the write mode, one of said bit lines with a third voltage and bringing remaining ones of said bit lines into one of a ground level state and an open state; and a second row selection circuit supplying, in the write mode, at least one of said source lines with a fourth voltage and bringing remaining ones of said source lines into an open state, said third voltage being different from each of said first, second and fourth voltages, wherein said second row selection circuit includes determination circuits connected to different ones of said word lines, for determining whether or not the potential of the word line is higher than a reference voltage between said first voltage and said second voltage, and switching elements connected between different ones of said word lines and a voltage source of said fourth voltage, said switching elements being adapted to turn on or off in response to the outputs of said determination circuits.

16. A semiconductor memory device comprising:

a plurality of word lines;

a plurality of source lines extending in parallel to said word lines;

a plurality of bit lines;

a plurality of memory cells each connected to an associated one of said word lines, an associated one of said source lines, and an associated one of said bit lines;

a first row selection circuit supplying, in a write mode, at least one of said word lines with a first voltage and remaining ones of said word lines with a second voltage lower than said first voltage;

a column selection circuit supplying, in the write mode, one of said bit lines with a third voltage and bringing remaining ones of said bit lines into one of a ground level state and an open state; and a second row selection circuit supplying, in the write mode, one of said source lines with a fourth voltage and bringing remaining ones of said source lines into an open state, wherein said second row selection circuit includes logic circuits connected to different ones of said word lines, for providing outputs corresponding to logics of potentials of the word lines and a write mode signal, and switching elements connected between the word lines and a voltage source of said fourth voltage, said switching elements being adapted to turn on or off in response to the outputs of said logic circuits.

17. A semiconductor memory device comprising:

a plurality of word lines;

a plurality of source lines extending in parallel to said word lines;

a plurality of bit lines;

a plurality of memory cells each connected to an associated one of said word lines, an associated one of said source lines, and an associated one of said bit lines;

a first row selection circuit supplying, in a write mode, at least one of said word lines with a first voltage and remaining ones of said word lines with a second voltage lower than said first voltage;

a column selection circuit supplying, in the write mode, one of said bit lines with a third voltage and bringing remaining ones of said bit lines into one of a ground level state and an open state; and a second row selection circuit supplying, in the write mode, one of said source lines with a fourth voltage and bringing remaining ones of said source lines into an open state, wherein said second row selection circuit includes determination circuits connected to different ones of said word lines, for determining whether or not the potential of the word line is higher than a reference voltage between said first voltage and said second voltage, and switching elements connected between different ones of said word lines and a voltage source of said fourth voltage, said switching elements being adapted to turn on or off in response to the outputs of said determination circuits.

18. A semiconductor memory device comprising:

a plurality of memory cell blocks, each of said blocks including a plurality of word lines, a plurality of bit lines, a common source line, and a plurality of memory cells each connected to an associated one of said word lines, an associated one of said bit lines, and said common source line; and a selection circuit for selecting one of said memory cell blocks, supplying a first voltage to one of said word lines in said one of said memory cell blocks, a second voltage substantially equal to a ground level voltage to said common source line in said one of said memory cell blocks and a third voltage to remaining ones of said word lines in said one of said memory cell blocks each of said word lines in each of remaining ones of said memory cell blocks, and for bringing each of the common source lines in said remaining ones of said memory cell blocks into an open state, wherein said first voltage is in a range of 5 to 12 V and said third voltage is in a range of 0.4 to 6 V.

* * * * *